(12) United States Patent
Louise et al.

(10) Patent No.: US 8,305,903 B1
(45) Date of Patent: Nov. 6, 2012

(54) DATA ACQUISITION SYSTEM FOR TEST AND MEASUREMENT SIGNALS

(75) Inventors: Justin Ralph Louise, Jamesville, NY (US); Kevin Roy Francis, Liverpool, NY (US); Brian David Harry, Baldwinsville, NY (US); Bryan Thomas Shepardson, Liverpool, NY (US)

(73) Assignee: C Speed, LLC, Liverpool, NY (US)

( * ) Notice: Subject to any disclaimer, the term of this patent is extended or adjusted under 35 U.S.C. 154(b) by 1252 days.

(21) Appl. No.: 12/079,973

(22) Filed: Mar. 31, 2008

(51) Int. Cl.
*H04J 3/14* (2006.01)

(52) U.S. Cl. .................. 370/241; 370/247; 370/251

(58) Field of Classification Search .................. 370/241, 370/246, 247, 251, 270, 357–359, 363
See application file for complete search history.

(56) References Cited

U.S. PATENT DOCUMENTS

| | | | |
|---|---|---|---|
| 6,956,923 B1 * | 10/2005 | Younis et al. ................ | 375/375 |
| 2007/0230648 A1 * | 10/2007 | Gupta et al. ................. | 375/371 |
| 2008/0018502 A1 * | 1/2008 | Wegener ...................... | 341/50 |
| 2008/0058962 A1 * | 3/2008 | Ward .......................... | 700/17 |

OTHER PUBLICATIONS

LeCroy Corporation, MS Series Mixed Signal Oscilloscopes, 2007.
Xilinx®, Virtex-4 Family Overview, pp. 1-9, DS112 (v3.0) Sep. 28, 2007.
Xilinx®, Virtex-4 User Guide, UG070 (v2.3) Aug. 10, 2007.
Xilinx®, Virtex-4 FPGA Configuration User Guide, UG071 (v1.10) Apr. 8, 2008.
Peter J. Ashenden, The Designer's Guide to VHDL (Systems on Silicon), 2nd ed., London UK: Morgan Kaufmann, 2002.

* cited by examiner

*Primary Examiner* — Yemane Mesfin
*Assistant Examiner* — Mon Cheri Davenport
(74) *Attorney, Agent, or Firm* — Kenneth J. Lukacher

(57) ABSTRACT

A system having an acquisition device for acquiring test and measurement data and providing such data to a computer system for display of such data. For each input data signal, the acquisition device has two differential receivers of opposite polarity each having an output coupled to the input of different ones of two pairs of registers, resulting in four registers sampling the input data signal periodically at four different times in accordance with two clocking signals of different phase (phase shifted 90°) to provide a sampling rate four times the rate of the clocking signals. The resulting sample data is stored in memory of the acquisition device along with downsampled data representing a compressed, low resolution, version of the sample data which records toggling in the sample data notwithstanding such downsampling. The computer system can request readout of stored sample data and/or downsampled data during or after acquisition of sample data and downsampled data. The acquisition device preferably utilizes an FPGA to provide sampling, storage and readout of data stored in memory of the device. The FPGA may be reconfigurable in response to the computer system to provide one of different data acquiring modes selectable by a user.

30 Claims, 11 Drawing Sheets

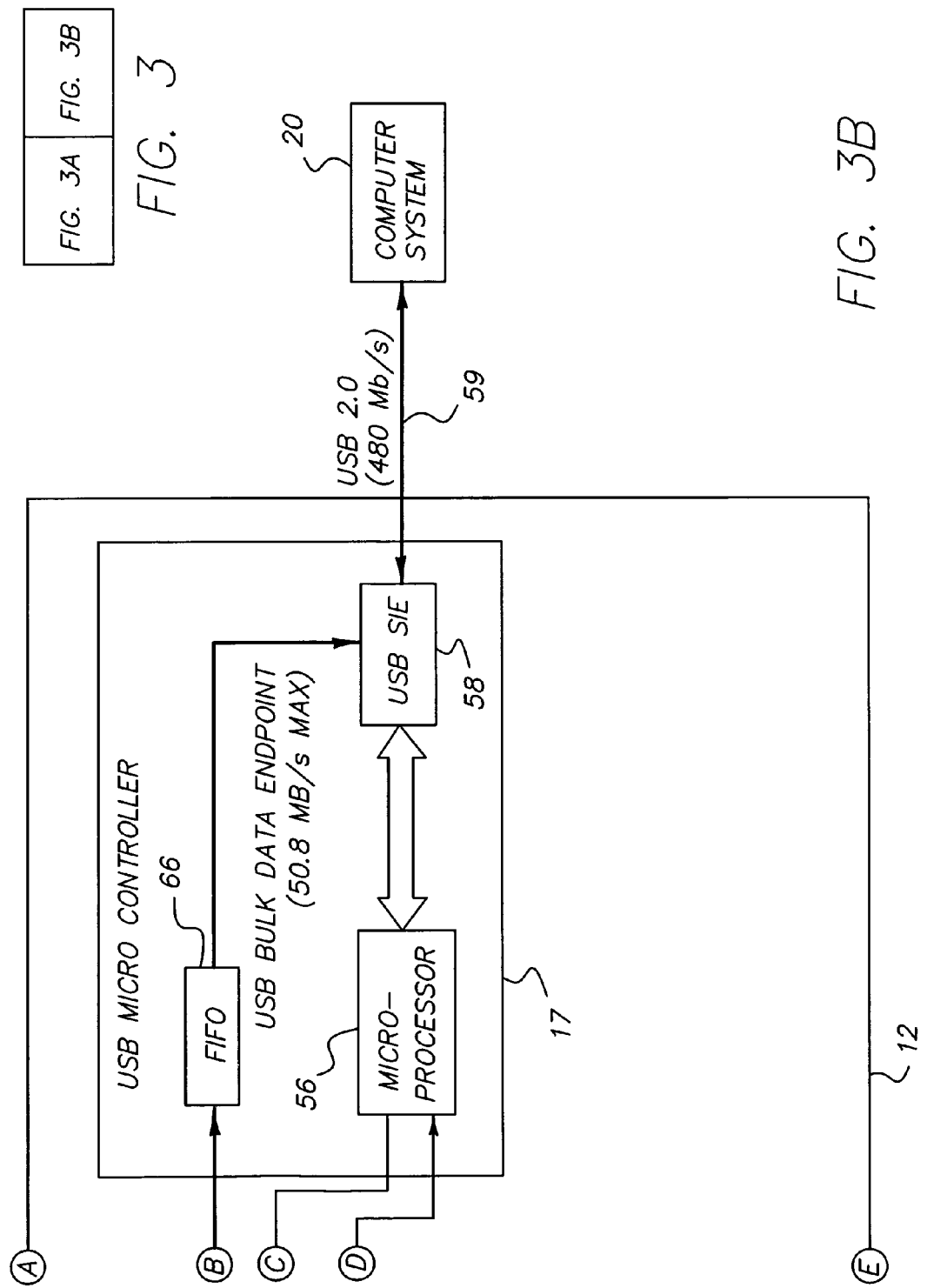

DATA ACQUISITION SYSTEM FOR TEST AND MEASUREMENT SIGNALS

FIELD OF THE INVENTION

This present invention relates to a system (method) for acquisition of test and measurement data and reading out the acquired data to a computer system, and relates particularly to a system for acquisition of test and measurement data capable of sampling up to a 2 Gigasamples per second (GS/s) input signal using a clock operating at 500 MHz. The invention is particularly suitable with a Virtex-4 family FPGA manufactured by Xilinx, Inc. of San Jose, Calif. Heretofore such Virtex-4 family FPGA with a clock speed of 500 MHz per second was configurable to acquire data rates only as high as 1 GS/s, while the present invention enables use of the same FPGA to achieve acquisition rates of 2 GS/s (i.e., 4×500 MHz clock speed). In addition, at the same time of acquisition of the sample data the acquisition device produces and stores in its memory downsampled data representing a compressed version of the sample data which records detected toggling in the sample data notwithstanding such compression. A fully arbitrated multi-port memory controller of the FPGA provides simultaneous for both data acquisition and readout to the computer system. Furthermore, the FPGA may be reconfigurable in response to the computer system to provide one of different data acquiring modes selectable by a user at the computer system.

BACKGROUND OF THE INVENTION

In the field of test and measurement, an acquisition device typically collects sample data from one or more electrical test points over some period of time, whereby the value of a sample represents the voltage level of the given test point at a specific point in that timeline. Samples collected in one time-contiguous sequence are commonly considered as a single acquisition. Common tools in this field today include logic analyzers and digital storage oscilloscopes, such as those manufactured by Agilent Technologies, Tektronix Inc. and LeCroy Corp.

Several features of the acquisition devices define their overall performance capabilities. First is the achievable sample rate. Higher rates allow more accurate sampling of the fast electrical signals. Second, is the acquisition device's memory depth, which determines the amount of data that can be collected during an acquisition and thus the duration of time-contiguous samples that can be gathered at once. The third is the rate at which collected data can be transferred to the rest of the acquisition system for processing and display to a user. A shorter cycle time for transferring the desired data from the acquisition device's memory and displaying it to the user provided for less down time between acquisitions, reduces delays for the user, and lessens the chance that events of interest on the unit under test are missed.

Acquisition systems typically have a host processing and display platform such as a dedicated hardware platform or an attached personal computer coupled to the logic analyzer, MSO, or digital storage oscilloscope, operating in accordance with software that can collect, store, and manipulate the data representing sample data over one or more signal channels, and renders such to the user.

Such acquisition device have logical elements which sample each input data signal received, FPGA chips have been designed with input/output registers for sampling data, such as the Virtex-4 family FPGA from Xilinx, Inc. Such an FPGA, once programmed, is part of the electronics of the acquisition device for storing data in memory. By design, the Virtex-4 family FPGA is configurable to acquire data rates as high as 1 Gigasamples per second (GS/s) using a 500 MHz clock. However, it would be desirable if such an FPGA could provide higher data rate sampling than 1 GS/s to improve performance without the need for a more expensive FPGA or specialized logical circuitry which typically requires use of higher clock speeds and logical elements capable to operating at such speeds.

One drawback of viewing high rate signals is that readout, processing, and display of such high rate data is difficult with communication bandwidth bottlenecks between the acquisition device and the host computer system and hardware limitations of the host computer system. Accordingly, it would be advantageous if a high rate signal was compressed at the acquisition device in its memory to facilitate readout to the host computer system, while at the same time storing the sampled data, such that both high and low resolutions of the same sampled data acquired at the same time are retained.

Each acquisition device is predefined in much of its function by its FPGA configuration, which is typically set at the time of manufacture of the acquisition device. Accordingly, different models or types of acquisition devices are necessary to achieve different acquisition functions or feature-sets. Thus, it would also be desirable if the acquisition device could be configurable by the attached computer, imperceptibly to the user of the device, thereby avoiding the need for different types of acquisition devices.

SUMMARY OF THE INVENTION

Accordingly, it is an object of the present invention to provide an improved system for acquisition of test and measurement data and reading out acquired data to a computer system.

It is another object of the present invention to provide an improved system for acquisition of test and measurement data which enables sampling input signals up to 2 GS/s using an FPGA previously limited to sampling at 1 GS/s.

A further object of the present invention is to provide an improved system for acquisition of test and measurement data having an acquisition device which is capable of downsampling data acquired at a high input rate to compress the acquired data while recording any toggling event that may have occurred in the downsampled data.

It is still a further object of the present invention to provide an improved system for acquisition of test and measurement data having a computer system which automatically selects for readout one of downsampled data or full resolution sample data from memory of an acquisition device to provide for a faster update rate of display to a user.

Another object of the present invention is to provide an improved system for acquisition of test and measurement data which enables both simultaneous acquisition to memory and readout from memory of sample data to a computer system.

A yet another object of the present invention is to provide an improved system for acquisition of test and measurement data which utilizes an acquisition device having an FPGA reconfigurable in response to a user selection on the computer system coupled to the acquisition device.

Briefly described, the system embodying the present invention has an acquisition device for receiving one or more input signals, and for each one of one or more input signals the acquisition device has two pairs of registers each having an input, an output, and an enable input to latch a signal at the input to the output, two differential receivers of opposite polarity each having an output coupled to the input of different ones of the pair of registers, in which each of the differential receivers receives simultaneously the same input signal, wherein two clocking signals of different phase are each coupled the enable input of a different ones of the pair of registers, in which the enable input to one of the registers in each of the pairs of registers is inverted, to enable the registers to sample the input signal provided by the differential receivers at four times the rate of the clock signals. The outputs of the registers of one pair of the registers is inverted to match the polarity of the outputs of the registers of the other pair of registers to provide sample data representative of the input signal. The acquisition device has memory for storing the sample data for each of the channels.

The system may further have a computer system for requesting sample data from the acquisition device and the acquisition device providing the requested sample data from the memory to the computer system. The computer system may then render the sample data for one or more of the channels to the display.

The acquisition device may further have for each of the input signals, i.e., channels, a downsampler receiving the sample data from the four registers associated with the channel. This downsampler produces for every M number of sample data values received from registers of the channel associated with the downsampler, downsampled data having a state bit representative of at least one of the M sample data values, and a toggle bit recording the occurrence of a toggle event that occurred during the M sample data. For example, M may equal 1,000. A memory controller is provided in the acquisition device having multiple ports, a first port receives sample data from the registers for all of the channels and the controller then stores the received sample data in memory, and second port receives downsampled data from all of the channels and the controller then stores the received downsampled data in memory, and third port for readout of one of the sample data and/or downsampled data stored in memory to the computer system. The memory controller generates pointers to memory for storing sample data and the downsampled data received at the first and second ports, respectively, preferably in separate buffers of such memory, and provides such pointers simultaneous to the computer system.

Upon user selection of a timeframe of the acquisition, the computer system automatically requests from the acquisition device readout of sample data or downsampled data (or both) from acquisition device memory in accordance with the selected timeframe, and resolution of the screen (or window) of the display, e.g., the number of horizontal pixels in which to display such readout.

Another controller operating in accordance with USB or other communication protocol may be provided in the acquisition device to facilitate providing pointers to the computer system and readout of computer system requested data at addresses via the memory controller from acquisition device memory.

Preferably, the components for enabling the sampling, storage and readout of data, such as provided by the differential receivers, registers, memory controller, downsampler, generation of the two phase shifted clocking signals from a clock, and distribution of such signals to registers, are provided by a configured FPGA in the acquisition device. Using an FPGA, such as for example the Xilinx, Inc. Virtex-4 family FPGA having a 500 MHz internal clock, enables acquisition of input signals up to 2 GS/s in which the registers are operated in accordance with a two phase shifted clock signals derived from the internal clock of the FPGA.

In another embodiment, the FPGA is reconfigurable to provide different modes of operation in accordance with different configuration files stored on the computer system which may be transferred to the acquisition device to reconfigure the FPGA. The system in accordance with this embodiment has a computer system, and an acquisition device having an FPGA for sampling input signals and storing data representative of sampled signals, in which the FPGA operates in accordance with configuration and settings at the FPGA defining FPGA operation. The computer system has memory storing a plurality of FPGA configurations, and the computer system in response to user selection of one or more characteristics of acquisition device operation, automatically determines one of the stored FPGA configurations providing the selected one or more characteristics, and transfers the determined one of the FPGA configurations to the acquisition device which is then applied to the FPGA to reconfigure FPGA operation. Preferably, the computer system has memory storing current settings of the acquisition device, and after the FPGA configuration is updated, the settings are transferred from the memory of the computer system to the acquisition device to restore the settings of the FPGA so that the reconfiguration appears seamless to the user without disrupting user operation of the acquisition device.

DETAILED DESCRIPTION OF THE DRAWINGS

The foregoing objects, features and advantages of the invention will become more apparent from a reading of the following description in connection with the accompanying drawings, in which:

FIGS. 3A and 3B are connected block diagrams, oriented as shown in FIG. 3, of the acquisition device of FIGS. 1 and 2 showing in more detail the data flow of signals in the acquisition device in which each of the input signals (channel) has a different one of demultiplexer and downsampler shown;

DETAILED DESCRIPTION OF THE INVENTION

Figure 1:
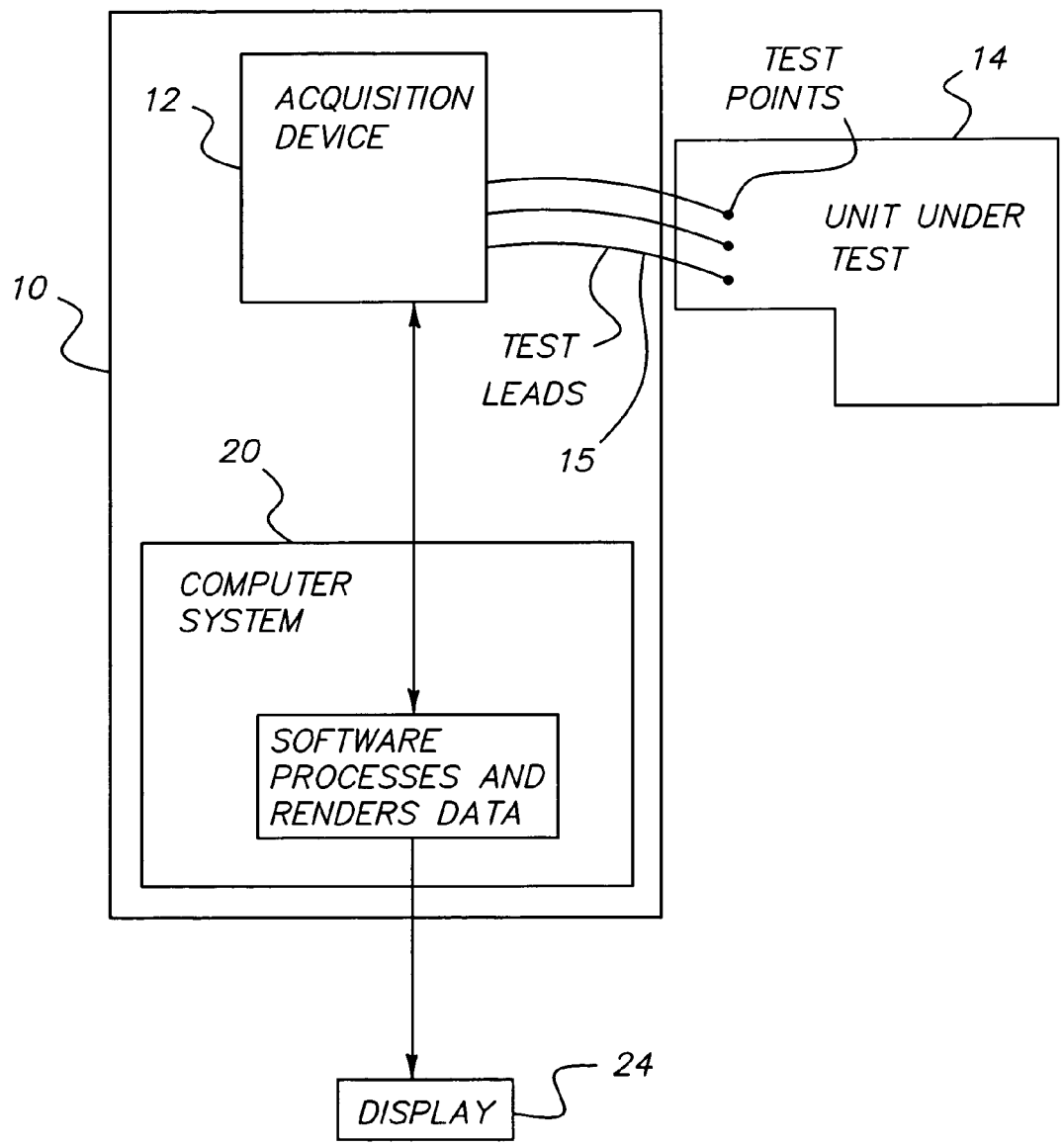
FIG. 1 is a block diagram of the system of the present invention having an acquisition device for receiving input signals and a computer system for rendering of data representing multiple channels on a display representative of data provided from the acquisition device.
Figure 2:
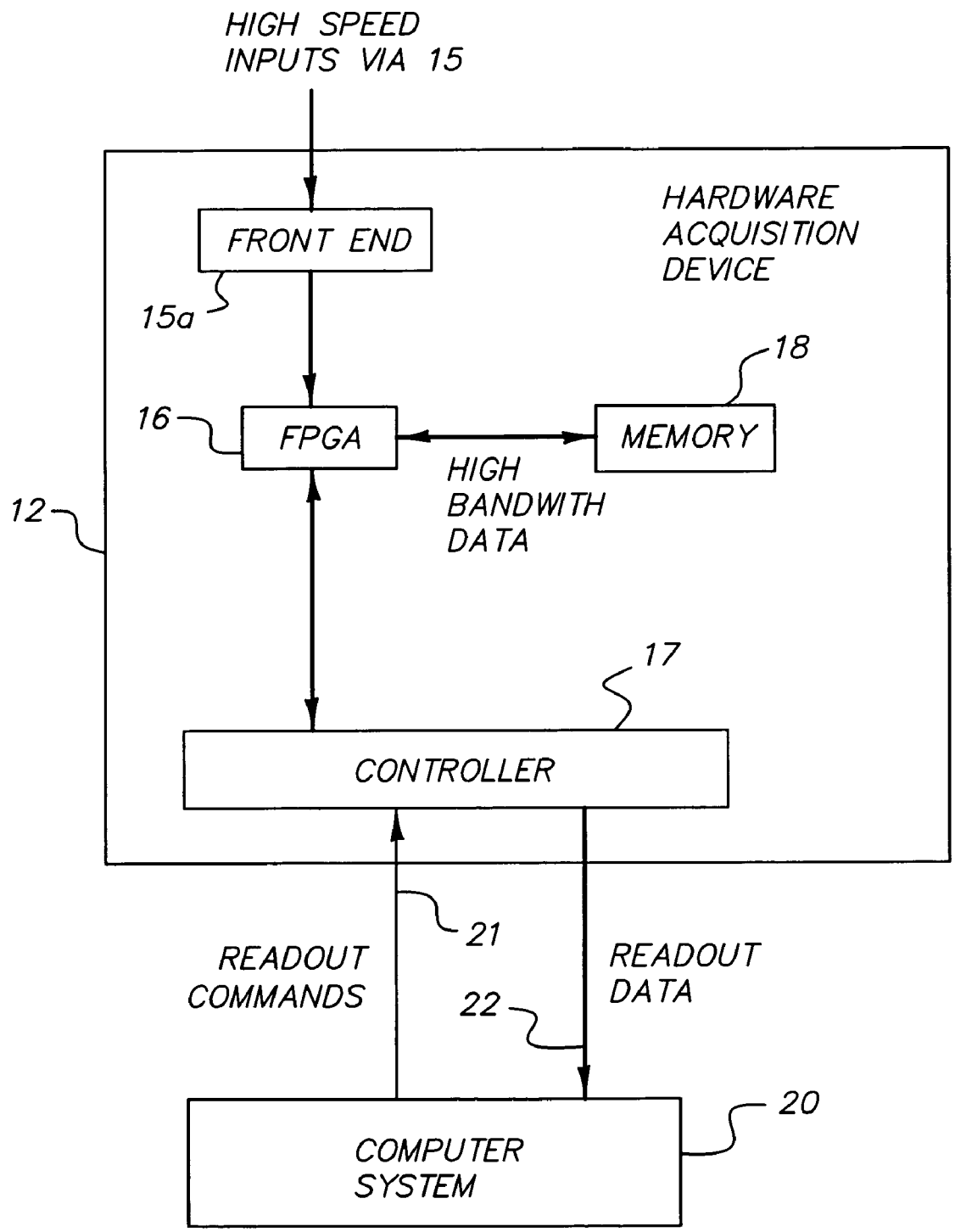
FIG. 2 is a block diagram showing the acquisition device and computer system of FIG. 1 in more detail.

Referring to FIGS. 1 and 2, the system 10 of the present invention has an acquisition device 12, which receives multiple channels of electrical signals having amplitude or value over time from a device (unit or system) 14 under test, via test leads 15, and converts each of the electrical signals into digital data utilizing a front end 15*a* and a processing unit provided by an FPGA (field programmable gate array) 16 for storage in memory 18. A controller 17 in the acquisition device 12 provides an interface between the FPGA 16 and a host computer system 20, whereby computer system 20 may request data stored in memory 18 and controller 17 provides readout 22 of such data requested. The computer system 20 stores the received data in its memory (RAM or hard/optical drive) for rendering of the data by the computer system on display 24. Computer system 20 may represent a personal computer, work station, laptop computer, or other microprocessor based platform that is coupled to display 24 that operates in accordance with typical software that manipulates the data representing sample data over one or more signal channels, and renders such to the user in a pseudo real-time or non real-time fashion on a display. The rendering hardware or software of the computer system 20 of transferred digital data from the acquisition device 12, may be the same as typically used in personal computer that are coupled to logic analyzer, or a digital storage oscilloscope, such as manufactured by Agilent Technologies, Tektronix Inc., and LeCroy Corp. Although not shown, a user interface, such as a keyboard, mouse, touch screen surface upon the display, or combination thereof, are part of computer system 20 for enabling the user to control system 10.

Figure 3A:
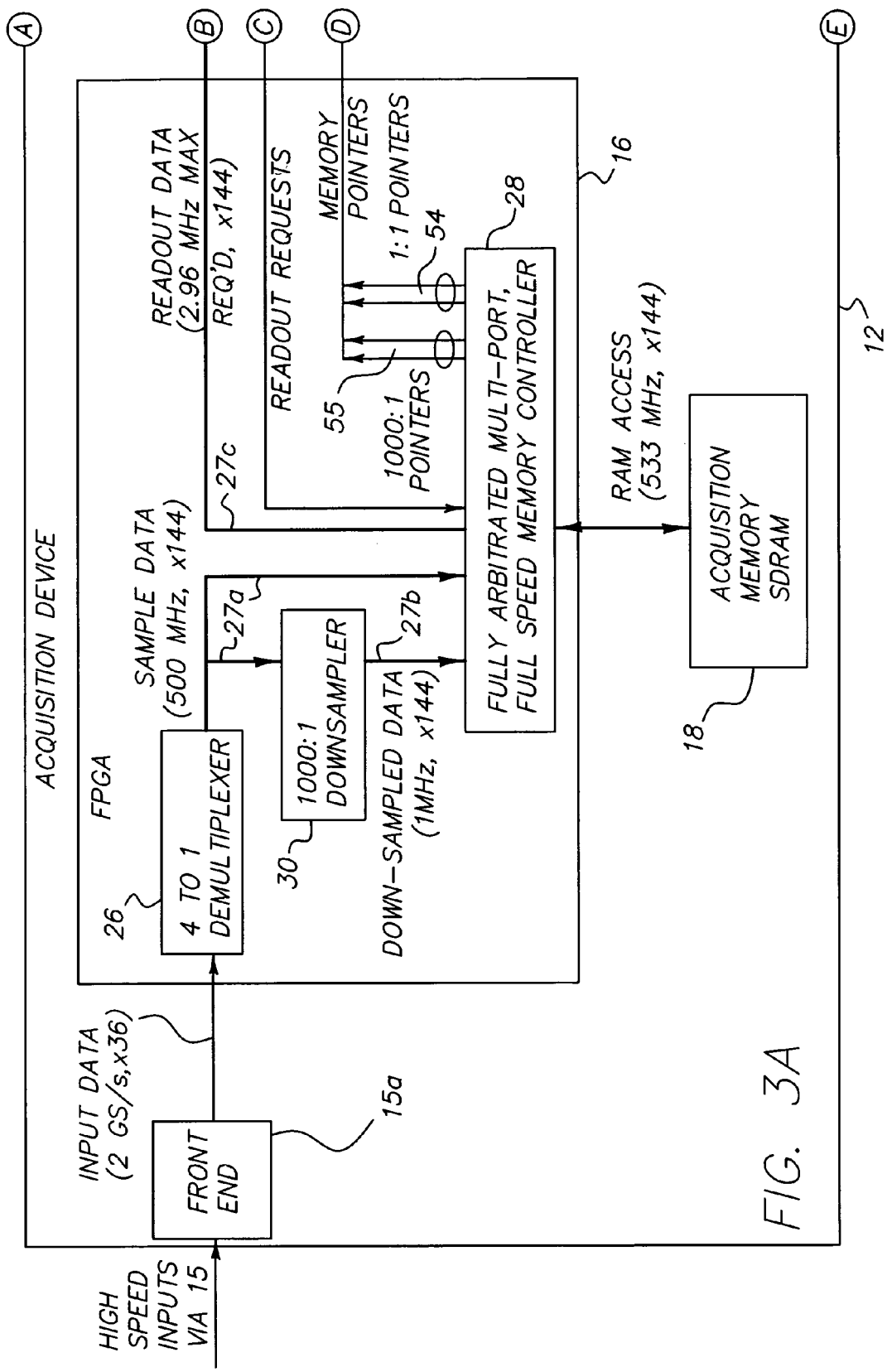

Referring to FIGS. 2 and 3A-3B, acquisition device 12 is shown in more detail in which lines bridging FIGS. 3A and 3B are connected by circled letters. The front end 15*a* receives each one of the channels from the unit or device 14 under test. For purposes of example, three leads 15 are shown for providing three electrical signals, but other number of leads may be used depending on the acquisition device 12. For example, there may be 36 channels each provided from one of leads 15. For each of the input signals provided by leads 15, the front end 15*a* converts the input signal into a differential signal that represents each input signal as one of two digital states (0 or 1) using a commonly available high speed comparator (as shown at 32 of FIG. 4), such as an Analog Devices ADCMP562. Each input signal may be sampled at up to 2 GS/s rate via a 4 to 1 demultiplexer 26, which operates at 500 MHz clock speed of the FPGA 16 to capture the up to 2 GS/s input signal and provides a parallelized output where each output value represents four consecutive samples of the input data and each digital bit of each sample represents the value of one of the input channels at that sample time. A memory controller 28 then writes the data values from the demultiplexer 26 in memory 18 to provide stored sample data representative of the 2 GS/s analog input signal. The operation of the memory controller 28 will be described in more detail later is connection with FIG. 7.

Preferably, FPGA 16 is a Virtex-4 FPGA chip manufactured by Xilinx, Inc. The Virtex-4 FPGA has input receiver stages that provide two inputs to receive a differential signal, such as LVDS (low voltage difference signal). These receivers are available so that a desired input signal can be received regardless of polarity of the two differential signals. In a typical application of the Virtex-4 FPGA, only one or the other of the LVDS receivers is used. However, the present invention's use of the Virtex-4 FPGA which heretofore was not realized and provides unexpected results in that both LVDS inputs are used simultaneously to provide additional sampling of the input signal at two different dual differential receivers (DDR) of opposite polarity available on the internal I/O blocks or tiles of the FPGA chip. However, this results in the outputs of the second DDR I/O tile being inverted. To compensate, inverters are added along the outputs of the second I/O tile. The ability to double the sampling enables sampling of four times the clock speed of the FPGA, rather than the heretofore maximum sampling of the FPGA of the prior art of 1 GS/s using a single LVDS receiver.

Figure 4:
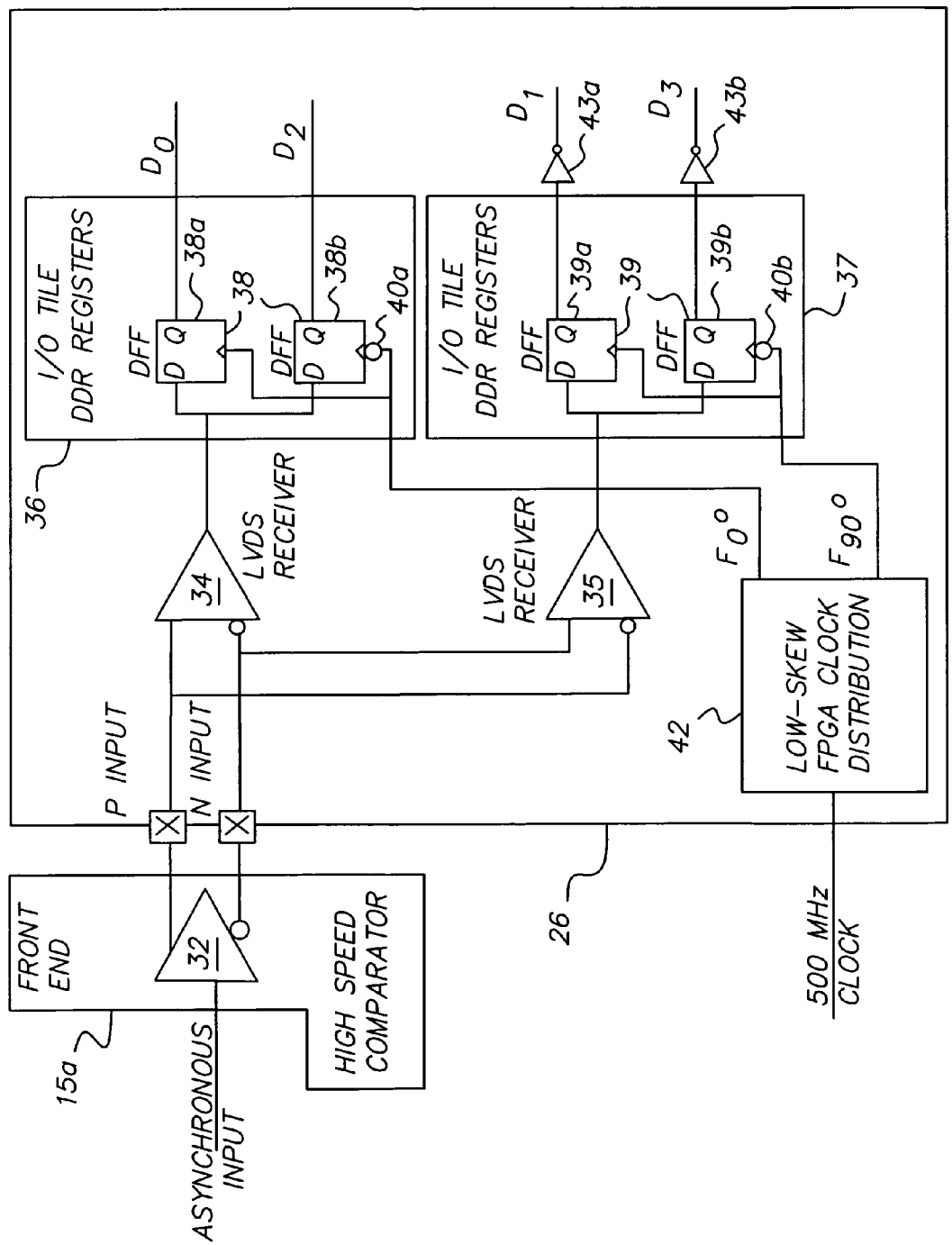
FIG. 4 is a diagram of the sampling logic implemented in the FPGA for the demultiplexer of one of the input signals of the acquisition device of FIG. 3A.
Figure 5:
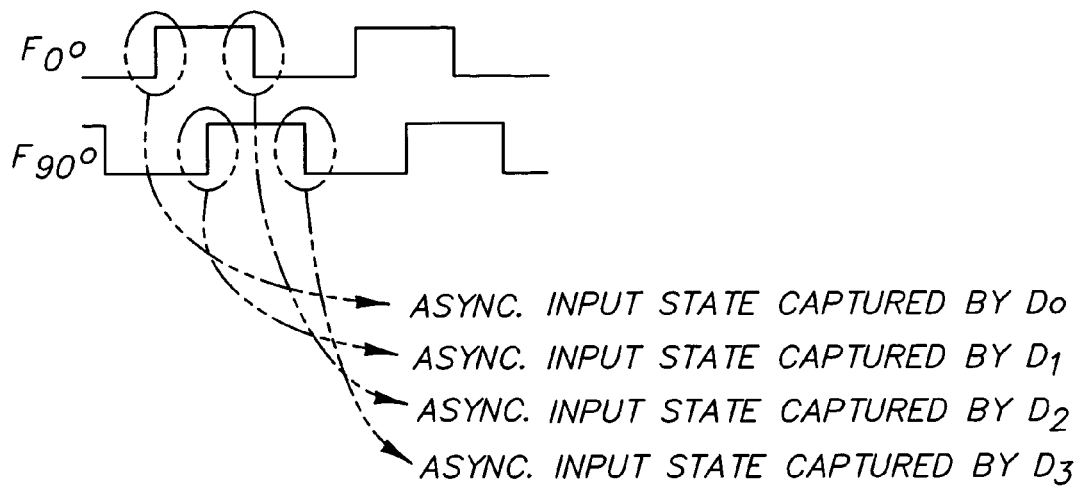
FIG. 5 is a signal diagram showing an example of the capture times by registers of the demultiplexer of FIG. 4 in accordance with a two phase shifted clocking signals on the rising or falling edges of such clock signals.

Referring now to FIG. 4, each asynchronous analog input signal is first received by a high speed comparator 32 that provides P inputs and N inputs to each of the two LVDS receivers 34 and 35. The output of LVDS receivers 34 and 35 are input to I/O tiles 36 and 37, respectively, and in particular to each of their two registers/latches 38 (38*a*, 38*b*) and 39 (39*a*, 39*b*), respectively. The 500 MHz FPGA clock is distributed (phase shifted) at 42 to provide two clocking (or clock) signals at 0° and 90°, such clock signals being referred to herein as phase shifted clocking signals. The 0° clocking signal is coupled to the enable of the register 38*a*, and is inverted to register 38*b*, via inverter 40*a*, while the 90° clocking signal is coupled to the enable of registers 39*a*, and is inverted to register 39*b*, via inverter 40*b*. Registers 38*a* and 38*b* have output lines D0 and D2, respectively, and the registers 39*a* and 39*b* have output lined D1 and D3, respectively, which are then inverted by inverters 43*a* and 43*b*, respectively, to have the same polarity as D0 and D2. Registers 38*a*, 39*a*, 38*b* and 39*b* are thus enabled by their respective clocking signals as shown in FIG. 5 to capture the synchronous input value to their outputs D0, D1, D2, and D3, each providing a one bit sample of a "0" or "1" value periodically at different successive times. D0 is enabled by each rising edge of the 0° phase clocking signal, D1 is enabled by each rising edge of the 90° phase clocking signal, D2 is enabled by each falling edge of the 0° phase clocking signal, and D3 is enabled by each falling edge of the 90° phase clocking signal. Thus, the two clocking signals being phase shifted from each other at 0° and 90° enable four different, equally offset sampling times at the registers.

For each input channel there is a different one of high speed comparator 32 within front end 15*a* to a different one of the sampling logic circuit of FIG. 4 within the demultiplexer 26 on the FPGA 16 providing a set of D0 to D3 lines for the channel. Block 42 is shown as being in the sampling logic circuit of FIG. 4 for purposes of illustration, but preferably there is one instance of block 42 for all of the channels providing the two phase shifted clocking signals to each of the sampling circuits within the demultiplexer 26 on the FPGA 12. When all four registers 38*a,b* and 39*a,b* for each of the channel's demultiplexers 26 have latched new values, then memory controller 28 outputs each of the four one bit samples for each of the input channels in parallel (in the case of 36 channels this results in a 144 bit value) from the demultiplexer 26 onto a 144 bit data bus 27*a* arranged in the order that they were acquired by registers 38*a*, 39*a*, 38*b* and 39*b* to provide stored sample data representative of the 2 GS/s input signal. The parallelization of four consecutive samples worth of data at once eases the transfer of the data within the FPGA 16 and subsequent storage into memory 18.

For each channel, the four registers (logical elements) 38*a,b* and 39*a,b* has the effect of creating four independent sample streams D0, D1, D2, and D3, each at the FPGA chip's operation clock speed and utilizing the FPGA's internal clocking. However, since enabling of each of registers 38*a,b* and 39*a,b* is offset in phase by 90 degrees, the result is a combined sample rate of 4 times the FPGA clock rate. Given the current top rated Virtex-4's max clock speed of 500 MHz this achieves a true sample rate of 2 GS/s. This is twice the previously available rate of 1 GS/s, which would be obtained by use of a signal DDR register in the I/O tile in a typical configuration of the FPGA for sample data acquisition.

Additionally, since this clocking scheme can be provided by the global clocking resources of the FPGA, it allows inputs located anywhere in the FPGA chip to be used to form an array of configurations. As there is low skew in the distribution of clock lines throughout the FPGA chip, this allows very even sampling across a large number of input signals at the cost of only a single chip. Thus, clock signals provided to sampling logic registers 38$a,b$ and 39$a,b$ associated with each of the input signals enable synchronous (time-aligned) sampling by such registers in parallel.

Another feature is that since existing hardware or architecture of the FPGA chip is being used, there are no additional components needed in the acquisition device to achieve the 2 GS/s sampling rate, thus allowing for extremely cost effective means of increasing the sample rate capability of the device, while maintaining fidelity (being non-parasitic) of the high frequency content of the input signal.

Due to the high bandwidth, memory, and processor load that would be required to transfer and display the stored sample data from the acquisition device onto the computer system 20, the 144 bit output data bus 27$a$ from 4 to 1 demultiplexer 26 contains full 1:1 resolution sample data and is split into two identical streams. The first stream is used to store the full 1:1 resolution sample data into memory 18 by the memory controller. The second stream is compressed to decimate the samples by 1000:1 by downsampler 30 which are then output on data bus 27$b$ and the memory controller 28 stores that 1000:1 downsampled data in parallel in a buffer in memory 18 separate from the buffer of memory 18 that stores the 1:1 sample data. Each of the channels has a different one of downsampler 30 on the FPGA 16 receiving that four bit part of the data stream 27$a$ associated with the channel. For every 1,000 (M) number of sampled values from demultiplexer 26 for each input channel, downsampler 30 receives such samples from data bus 27$a$ and provides downsampled data of a first state bit having either a high (1 value) or low (0 value) representative of the current state of the signal at the 1 MHz sample time, and a second toggle bit having either a high (1) value indicating that a toggle occurred (i.e., value switched more than once during the previous M number of sample data). The 1 MHz clock for performing the downsample operation is derived from the internal 500 MHz clock of the FPGA. The downsampled data (a pair of state bit and toggle bit) from the downsamplers 30 of all the channels is also stored by memory controller 28 in memory 18 to provide a stored compressed, low resolution, version of the sample data at the same time such uncompressed sample data is also stored in the memory.

In test and measurement it is critical not to miss transitions of signals as these are often precisely what a user is looking for. At the high decimation rate of 1000:1, the reduced data stream might loose short duration data and transitions. For this reason, the input stream on data bus 27$a$ is reduced to the output stream on data bus 27$b$ while retaining indication of important transitions in the sample data by compression using a toggle bit as well as a state bit for each 1000:1 sample. As will be shown later, using this information, the computer system 20 is able to display the "glitch" or "uncertainty" that falls between any two 1000:1 samples, thereby the user will not miss an important event despite the high decimation rate.

Figure 6:
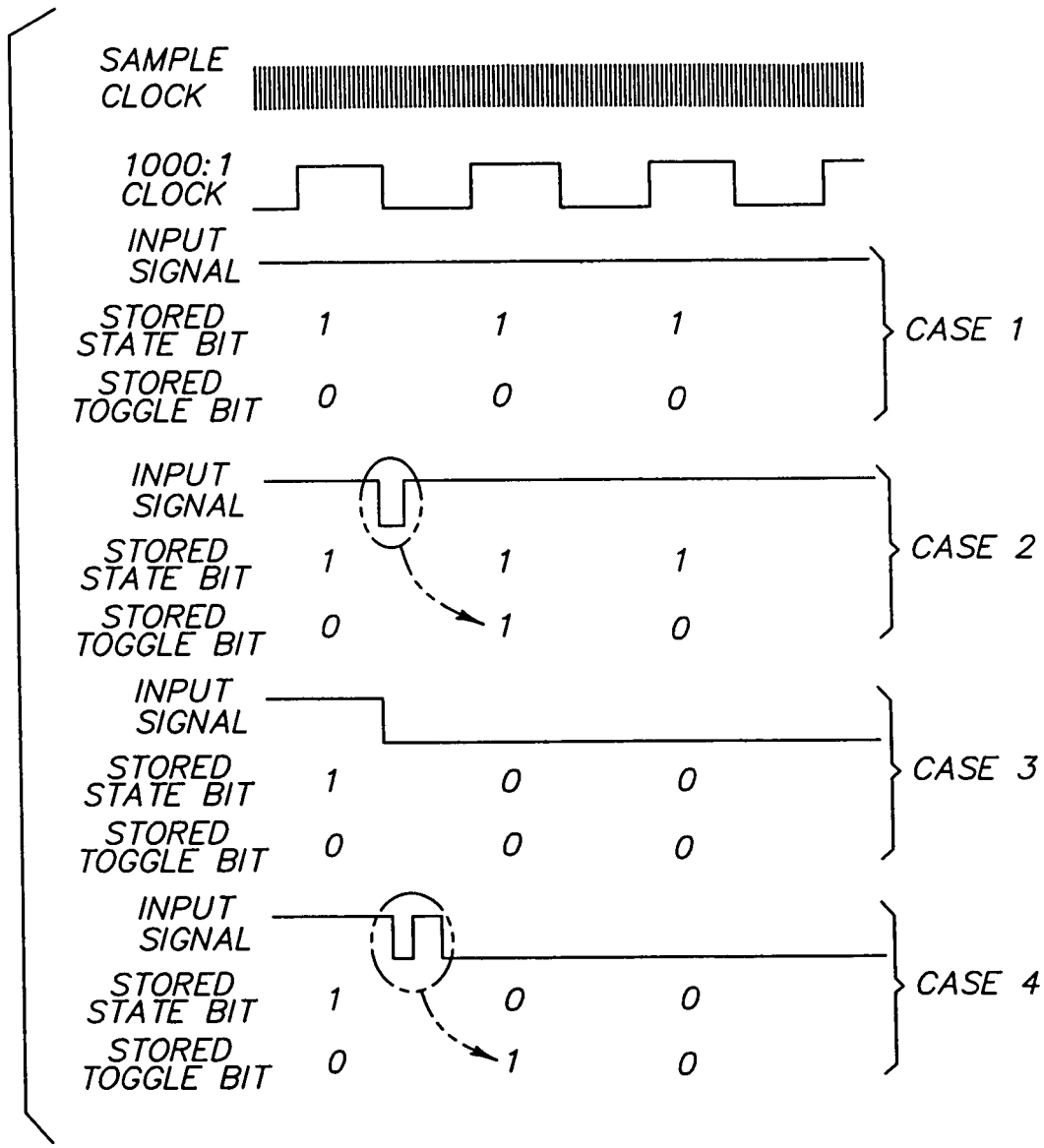
FIG. 6 is an example of timing diagrams of the state logic for the two bits outputted by the downsampler of FIG. 3A to provide downsampled data for four cases of an input signal.

FIG. 6 describes an example of the four cases of the compression by the downsampler 30; steady, toggle, transition, and toggled transition, respectively. While these cases are shown for an input signal starting in the high "1" state, there are also four similar cases (not shown) for a signal starting in the low "0" state. The downsampler may be operated by a 1000:1 Clock signal in which upon each rising edge the state bit is captured, and toggle bit determined. In Case 1, the state bit is always "1" and no toggling occurs, so the toggle bit is always a "0". Case 2 shows a signal with a toggle event missed by the state bit, and thus the toggle bit is set to 1. Case 3 shows how a single transition between two states is stored by the two successive state bits changing from "1" to "0" without any additional toggling (changing of state) occurring (i.e., toggle bit set to "0"). Case 4 shows a toggling occurring in addition to a transition of the two successive state bits changing form "1" to "0" and thus the toggle bit is set to "1". Although the downsample period is 1000:1, the resulting data compression ration is 500:1 because of the addition of the toggle bit. However, this is well worthwhile to retain the valued signal transition information. For a mere 0.2% extra memory 18 usage, all portions of the acquisition timeline are available for transfer to the computer system at a rate 500 times faster. Similarly, the software of computer system 20 may be able to process and display the data 500 times faster. This results in a much more fluid and responsive user experience where a much greater degree of useful data is visible to the user and important conditions are less likely to be missed. Although a 1000:1 decimation rate is described, different decimation ratios M:1 may be used.

Figure 7:
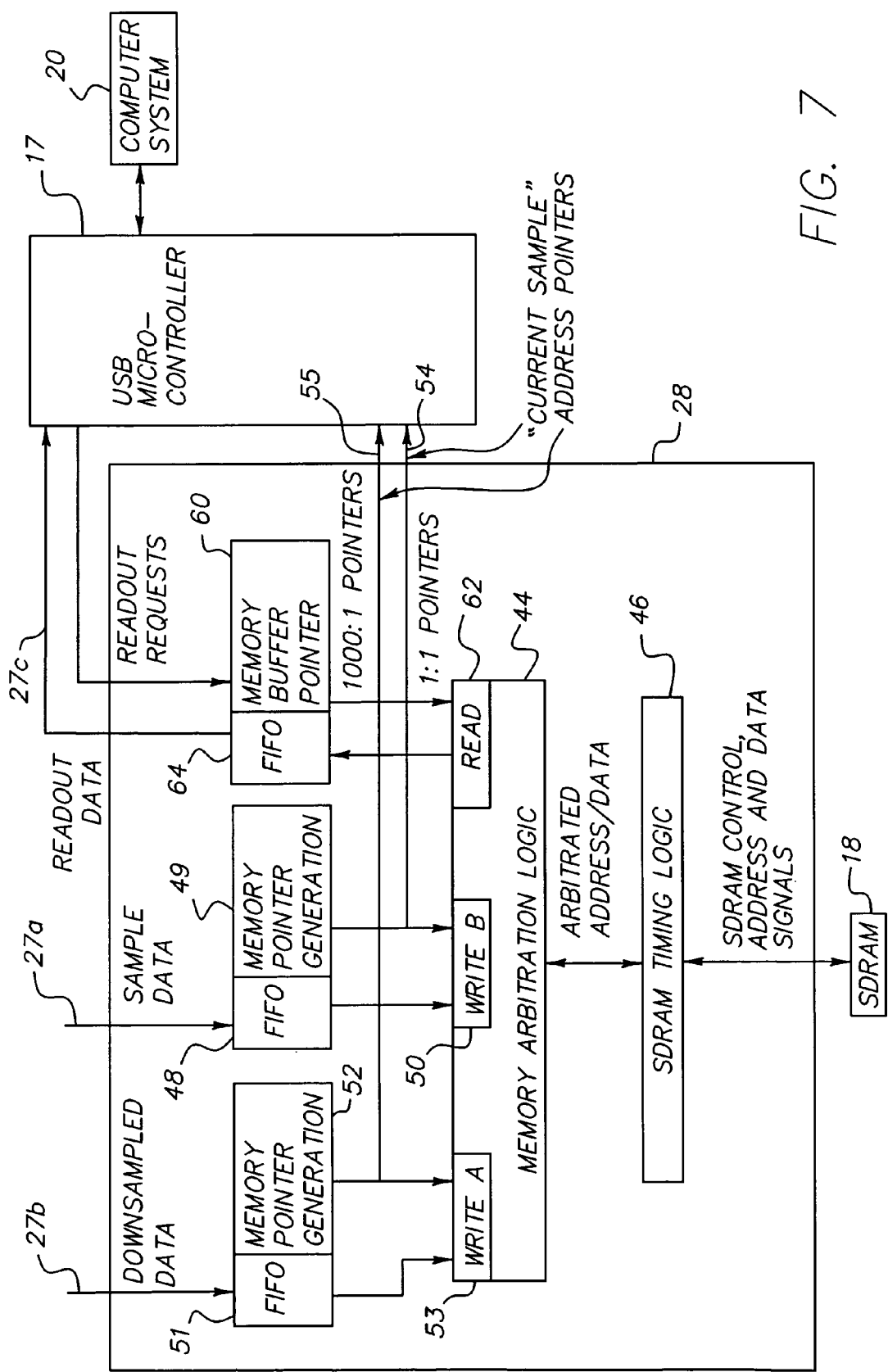
FIG. 7 is a block diagram of the memory controller of the acquisition device of FIG. 3A.

Referring to FIG. 7, the memory controller 28 is shown in more detail. Memory controller 28 is referred to as fully arbitrated multi-port memory controller, since it provides multiple (e.g. three) ports 53, 50, and 62 to busses 27$a$, 27$b$, and 27$c$, respectively, to store or read data from memory 18 simultaneously using memory arbitration logic 44, via SDRAM timing logic 46, to memory 18, shown as an SDRAM for example. SDRAM timing logic 46 provides control for addressing and read/write data signals, as typical for controlling reading and writing to memory address location in an SDRAM. The SDRAM is of a size sufficient to store the number of sample data and downsample data for the channels to provide the desired memory depth of acquisition device 12. Although one SDRAM is shown, one or multiple number of SDRAM chips may be used.

The periodically active sample data on data bus 27$a$ is received in FIFO buffer 48 to be written sequentially in memory 18 to maintain their chronological order. In order to determine an address in memory 18 to store sample data in FIFO 48, a memory pointer generator 49 provides an address location into memory 18, and such address along with the data from FIFO 48 is presented (or applied) to Write B port 50 for storing such data at such address location in memory 18. A predetermined 1:1 sample data storage buffer 68 is used in the SDRAM for storing all of the acquired channels in parallel. For each acquisition there is a preset start address and end address used by generator 49 to the 1:1 sample buffer 68, and the sample data values are sequentially stored.

Similarly, the 1000:1 downsampled data on data bus 27$b$ is received in FIFO buffer 51 to be written sequentially in memory 18 to maintain its chronological order. Preferably, the downsamplers 30 for each of the channels outputs all of their states bits and then their toggle bits for each of the downsampled data. If the bus is larger than the 72 bits (e.g., two bits×36 channels), as is the case when a parallel 144 bit bus is used, then a FIFO buffer may be provided to temporarily store downsampled data from the downsamplers 30 of all channels as they output their data before being placed on bus 27$b$. In order to determine an address in memory 18 to store sample data in FIFO 51, a memory pointer generator 52 provides an address location into memory 18, and such address along with the data from FIFO 51 is presented (or applied) to Write A port 53 for storing such data at such address location in memory 18. A predetermined 1000:1 sample data storage buffer 69 is used in the SDRAM for storing all of the acquired channels in parallel. For each acquisition there is a preset start address and end address used by generator 52 to the 1000:1 sample buffer 69, and the sample data values are sequentially stored.

Figure 8:
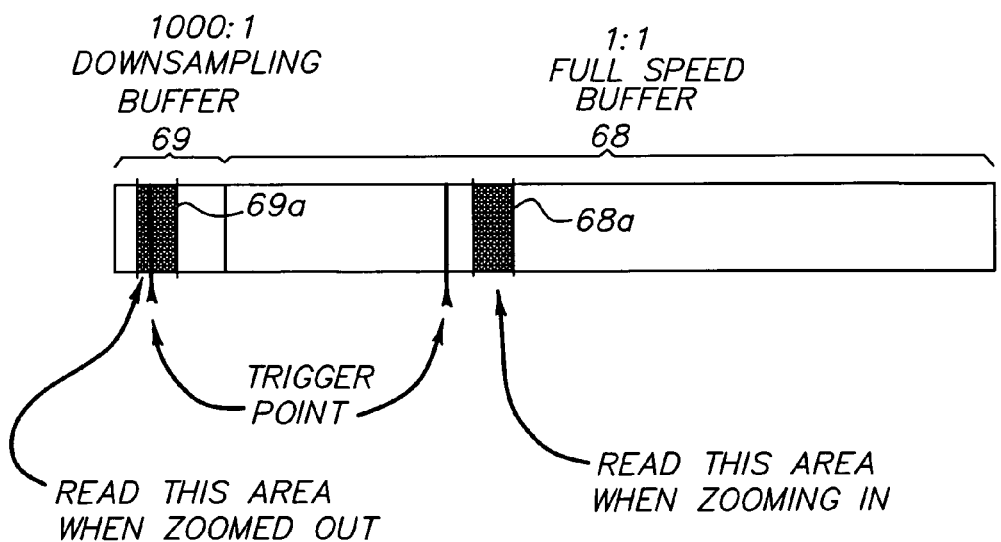
FIG. 8 is an illustration of the memory storing the 1000:1 downsampled data and the 1:1 full sample data in the acquisition device of FIG. 3A.

Memory pointer generators 49 and 52 are always at the exact 1000:1 ratio, so that data in buffer 68 can be unambiguously correlated to data in buffer 69 and vise-versa. The FIG. 8 illustration of the memory is not to scale, as the downsampled data uses only 0.2% of the available memory. When the 1000:1 and the 1:1 memory pointers point to the end of the buffer, either the acquisition stops or address locations are then overwritten starting from the first address location of the buffers, resulting in a typical circular buffer implementation. Although the above memory allocation is preferred, other allocation of memory 18 for storage of acquired sample data and downsampled data may also be used.

The memory pointers from generators 49 and 52 are referred to as 1:1 pointers 54 and 1000:1 pointers 55, respectively. As shown in FIG. 3A, pointer sets 54 and 55 are each received by a microprocessor 56 of USB controller 17 when generated and are sent via a USB SIE interface 58 via a USB connection 59 (wired cable or wireless) to computer system 20. The generators 49 and 52 produce both start and current memory location pointers 54 and 55 to 1:1 and 1000:1 buffers, respectively, and the computer system stores the most recent ones of each of pointer sets 54 and 55 received as the start and end pointers to available 1:1 and 1000:1 buffers, respectively. Thus, each one of pointers 54 sent to computer system 20 has two memory 18 addresses, a start address and an end address (i.e., current address of the last store) in the 1:1 buffer, and each one of pointers 55 sent to computer system 20 has two memory 18 addresses, a start address and an end address (i.e., current address of the last store) in the 1000:1 buffer. Typically, the start address of points 54 and 55 in their respective buffers remains constant at the beginning of the buffer unless the memory is filled and the buffer rolls over. The end pointers are thus continuously updated at the computer system 20 during acquisition by device 12 of one or more input signals. For example, USB controller 17 may be a USB Microcontroller chip model FX2LP such as manufactured by Cypress Semiconductor Corporation, of San Jose, Calif.

The computer system, via the USB SIE interface 58 can send a request command to the microprocessor 56 for readout of an address range from memory 18. In response, microprocessor 56 sends the address from the request command to a memory buffer pointer 60 (FIG. 7) of memory controller 28 which applies such address to a Read port 62 of memory arbitration logic 44. The address range generated by memory buffer pointer 60 may access either buffer 68 or buffer 69 or both. Memory arbitration logic 44, via timing logic 46, accesses the data stored at such address from SDRAM 18, and such data is then received by a FIFO buffer 64 via Read port 62 to a FIFO buffer 66 (FIG. 3A) of controller 17, and such data is then downloaded from FIFO buffer 66 to the computer system 20 via USB SIE interface 58 and USB connection 59. In operation, memory controller 28 enables the computer system 20 to start downloading of data stored in memory 18 to computer system 20 while the acquisition device 12 continues to acquire more data in its memory 18. This overlaps the acquisition and readout times and reduces the impact of the readout bandwidth bottleneck which would undesirably reduce the acquisition cycle time. This provides both maximum input rate and maximum readout rate attainable by the device with minimum additional overhead.

A feature of memory controller 28 of FIG. 7 is that the available data transfer bandwidth to the SDRAM 18 is able to support the aggregate data rate of all streaming busses 27a, 27b, and 27c. The FIFOs 48, 51, and 64 provide buffering so that the streaming interface to busses 27a, 27b, and 27c respectively may execute in an uninterrupted fashion. In memory arbitration logic 44, the three ports 50, 53, and 62 are arbitrated such that the FIFO 51, 48, and 64, respectively, is serviced enough so that FIFOs 51 and 48 never overflow and FIFO 64 never underflows.

The data rates through the acquisition device 12 are coordinated to achieve the 2 GS/s sample rate and also maintain full loading of the maximum throughput rate supported by the acquisition device's communication link to the computer system 20. Preferably, the 2 GS/s input and high speed USB output may be achieved using typical 533 MHz SDRAM of memory 18 and still have enough memory bandwidth available to store the 1000:1 compressed data. Such an SDRAM can achieve storage of 2 GS/s sampling as well as downsampling and readout in parallel. The memory controller 28 is advantageous over the use of a single ported memory device that can only start to download new data to a computer system 20 once the acquisition has completed, since memory controller 28 allows the download and display of data immediately after the acquisition begins and then continued in parallel with the acquisition. The user thus can begin examining the data from the device 12 in a pseudo real-time fashion on display 24, even for long duration acquisitions. This is increasingly useful at slower input data rates, i.e., less than 2 GS/s, because the slower the sample rate, the more the buffer fill time increases. Thus the user can more quickly determine whether the data is useful or if the desired condition/event has occurred before the acquisition even completes. If the input sample rate is sufficiently slow, the data may be displayable to the user as fast as it is acquired, which can free memory back up for being used to continue the acquisition. In such a mode the device can be more of a real-time system monitor than a traditional acquisition device and could provide continuous, unbroken sampling of the unit under test.

Figure 9:
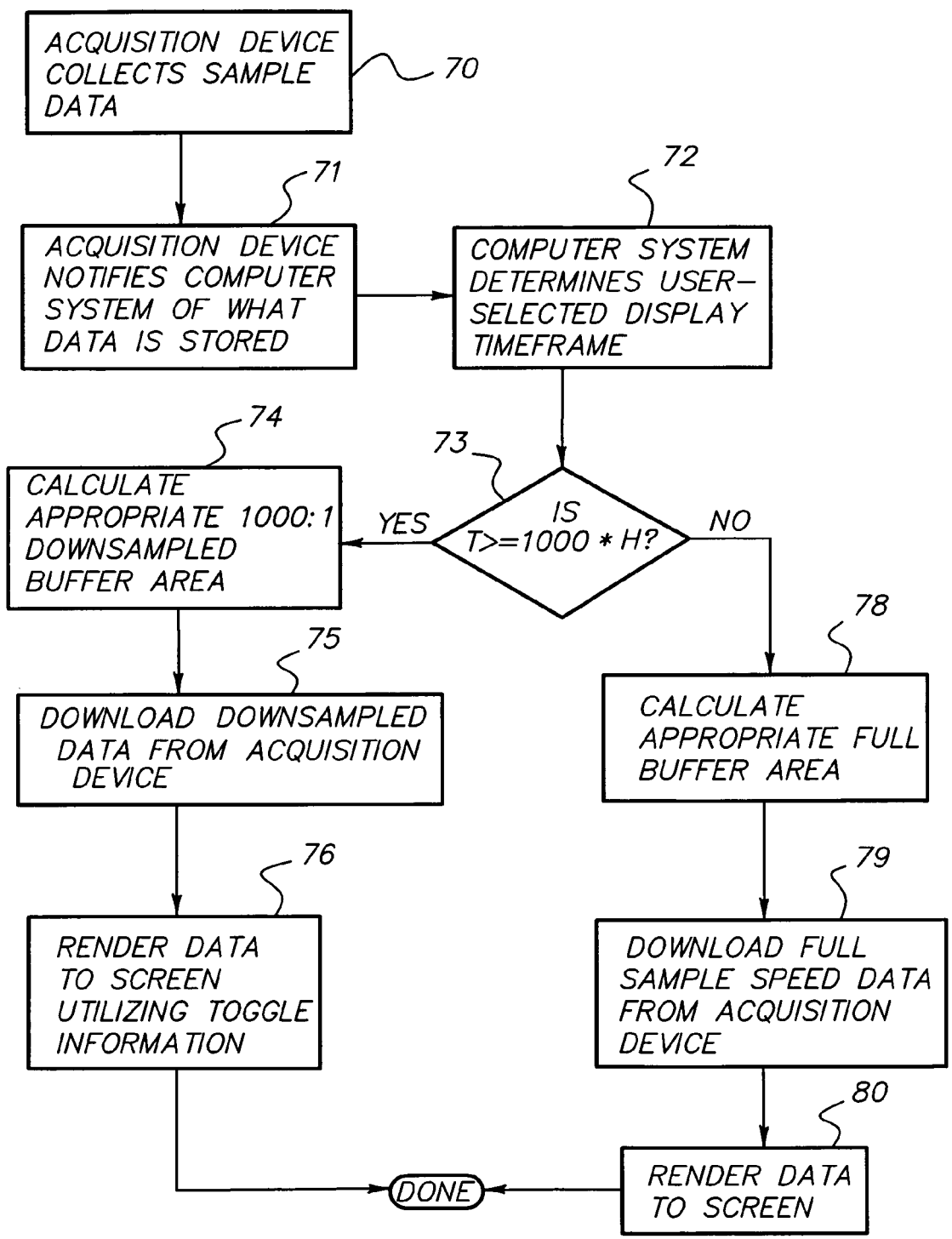
FIG. 9 is a flow chart showing the operation of the computer system of FIG. 1 when selecting one of downsampled data or full sample data for readout and display.

Referring to FIG. 9, the computer system 20 software's logic in system 10 for selection, readout, and display of 1000:1 downsampled (compressed) data and 1:1 sample data stored at the acquisition device 12 is shown. First, the acquisition device 12 starts to collect and store 1:1 full resolution sample data and 1000:1 downsampled data in its memory 18 as described above (step 70). The acquisition device notifies the computer system 20 what data is stored, such as by receiving and storing in memory of system 20 running pointers 54 and 55 to the 1:1 and 1000:1 buffers, respectively, where data is stored in the acquisition device memory 18, or by receiving an acquisition complete message (step 71). The computer system 20 then determines the user selected display timeframe of the acquired signal(s) to be displayed via the user interface of the computer system (step 72).

The computer system 20 next determines whether the user selected display timeframe (T) is greater than or equal to 1000 times the number of horizontal screen pixels available (H) (step 73). The number of horizontal screen pixels depends on the window selected by the user on the computer system in which to display the data. If so, then the computer system determines an area of the 1000:1 downsampled buffer 69, such as shown for example by an area 69a (FIG. 8), associated with the user selected display timeframe (step 74). The computer system 20 downloads the data stored in this area 69a from acquisition device 12 by determining the addresses associated with the data in this area in memory 18 using the start and end pointers stored from received 1000:1 pointers 55 (step 75). The addresses of each address location between such start and end pointers are determinable, since the index used in generating addresses by the pointer generator 52 (FIG. 7) is a preset value set in the computer system 20, such that the computer system can calculate the first address of area 69*a* and last address of this area of the user selected timeframe, and each intermediate address there between, and request readout of data of such addresses from the acquisition device 12, as described earlier. The downsampled data for all the channels from the requested addresses are provided to the computer system 20, and the rendering software on the computer system may display on display 24 the downsampled data of one or more of the channels as desired by the user in a time aligned fashion. The computer system 20 can parse through the read data to obtain each pair of state bit and associated toggle bit downsample values.

During step 75, the downloaded data is stored in memory of the computer system 20, and rendered to the display's screen, where for each 1000:1 downsampled data the value its state bit is used to generate a graphical representation of level (0 or 1), and its toggle bit if "1" is represented graphically by transitioning, or other indication, between the displayed state bit level and the prior displayed state bit level regardless of whether the state bit values changed (step 76). The rendering onto display 24 should be similar to that shown from rendering the full 1:1 sample data. Due to limitation of the display size, detail, is not renderable on display 24 by the computer system 20 beyond that provided by 1000:1 downsampled data, since no additional pixels are available to show further detail. The rendering of toggling events by use of the toggle bits for each of the channels enables the user to detect whether a "glitch" or "uncertainty" may have occurred between any two 1000:1 rendered state bits for each of the channels.

If T is not greater than or equal to 1000*H, at step 73 the computer system 20 calculates the 1:1 full buffer area, such as shown for example by area 68*a* (FIG. 8), associated with the user selected display timeframe (step 78). The computer system 20 downloads the data stored in this area 69*a* from acquisition device 12 by determining the addresses associated with the data in this area in memory 18 using the start and end pointers stored from received 1:1 pointers 54 (step 79). The addresses of each address location between such start and end pointers are determinable, since the index used in generating addresses by the pointer generator 54 (FIG. 7) is preset value set in the computer system 20, such that the computer system can calculate the first address of area 68*a* and last address of this area of the user selected timeframe, and each intermediate address there between, and request readout of data of such addresses from the acquisition device 12, as described earlier. The computer system 20 downloads the 1:1 full speed sample speed data from the acquisition device (step 79) and renders the data received to the display (step 80). The sample data for all the channels from the requested addresses are thus provided to the computer system, and the rendering software on the computer system may display the 1:1 sample data on display 24 for one or more of the channels as desired by the user in a time aligned fashion as typical output of a digital oscilloscope or logic analyzer. During step 80, the downloaded data is stored in memory of the computer system 20 and rendered to the display's screen. Once the rendering of data at steps 76 or 80 is done, the computer system waits for the user, via the user interface of the computer system, to select a different time frame at step 72, and steps 73 and steps 74-76 or steps 78-80 are then again performed.

Preferably, readout by computer system 20 is simplified by defining maximum memory 18 depth such that the 1:1 sample data storage in memory 18 holds exactly 1000 times the number of samples as the 1000:1 downsampled (compressed) data in memory 18. This provides efficient use of the memory as well as easy synchronization and conversion between using compressed and full resolution data. For example, the sample retrieved from a point N % into the 1:1 buffer of memory 18 will always be time aligned with those N % into the 1000:1 buffer of memory 18 in terms of the original acquisition.

As shown above, the computer system 20 at step 73 determines when to download data from the 1:1 full resolution sample data buffer of memory 18 and when to select the 1000:1 compressed data buffer from memory 18. Preferably, the computer system 20 reads the compressed data when the user zooms out to a large timeframe on the screen. When the user is zooms in close, the computer system 20 reads the 1:1 full sample data from memory, but has no need to receive most of the acquisition timeline as it is not visible. Thus, computer system 20 is not required to read more than the target area of the stored data, or worst case approximately 1,000,000 points (2,000,000 pieces of data when downsampled) for any screen update, while still obtaining the maximum detail renderable on the display given the display's limited available pixels.

It is common in test and measurement systems to define a trigger event desired by the user in accordance with the state (s) of one or more of the channels. As typical of the use of the FPGA described herein, such trigger is detectable by the FPGA logic. In operation, the FPGA 16 may be in a mode to continuously acquire data from the channels for R % (e.g., R may equal 50 or other percentage as set by the user) of its 1:1 and 1000:1 buffers of memory 18, until detection of a trigger event, whereas an additional S % of its 1:1 and 1000:1 buffers are utilized as configured by the user provided that R %+S % do not exceed 100% of the available memory. An illustration of a trigger point in each of the buffers 68 and 69 is shown in FIG. 6. Further, system 10 may operate in a continuous mode where each new acquisition resets its pointer generators 52 and 54 to their preset start address, and thus the computer system 20 may overwrite the previous acquisition on display 24, or in a single acquisition mode where the device 12 stops storing data to memory following the completion of one trigger event and use of R %+S % storage in buffers of memory 18.

The computer system 20 display of downsampled data at step 76 allows the user to fluidly zoom in and out and view any amount of the acquisition, providing both high and low resolution viewing of the each sampled input signal. For instance, a user using the user interface of the computer system 20 can click a point or region of interest (step 72) on the displayed image, and then depending on step 73 view the high resolution 1:1 sample data about such point or region. Similarly, the user using the user interface of the computer system 20 can click to zoom out from any point on the displayed 1:1 sample data at step 80, and may view the 1000:1 downsampled data about such point. The computer system 20 can automatically and seamlessly switch between the different resolution data streams to provide fluid and quick display updates in response to the user's requests, while showing maximum detail and never being forced to download or process the full number of samples (which may for example be $10^9$ or more samples) available in the stored 1:1 sample data from memory 18.

As stated earlier to enable multiple channels of input signals to be sampled and stored by acquisition device 12 and provided to computer system 20, the FPGA 16 has multiple instances of the logic shown in FIG. 4 within the demultiplexer 26 each connected to a different one of the multiple channels, and multiple instances of the downsampling logic shown in FIG. 6 within the downsampler 30 for each different channel's data. The same memory controller 28 (FIGS. 3 and 7) is used for all the multiple channels in parallel. Pointers 54 and 55 thus represent the addresses for all of the different channels as they are always sampled simultaneously and these are provided to controller 17 and then to the computer system 20, as described earlier.

The FPGA 16 is configured to provide the functionality described above in accordance with the literature and software associated with the particular FPGA for enabling logic of the various components of the FPGA, where Xilinx Virtex-4 FPGA is used, such may be as described for example in the publications: "Virtex-4 User Guide": Xilinx Inc., 2007, or Peter J. Ashenden. *The Designer's Guide to VHDL.* 2$^{nd}$ ed. London, UK: Morgan Kaufmann, 2002. The source code for programming specific parts of the Xilinx Virtex-4 FPGA is as follows:

A) Source Code for dual DDR module, which instantiates the two LVDS receivers 34 and 35, I/O Tile DDR registers 36 and 37, and inverters 43a and 43b as shown in FIG. 4:

```
library IEEE;
use IEEE.STD_LOGIC_1164.all;
library UNISIM;
use UNISIM.VCOMPONENTS.all;
entity dual_ddr_8to1 is
   port(
      clk_din : in STD_LOGIC;         -- 500 MHz clock
      clk_din_phi : in STD_LOGIC;     -- 500 MHz clock shifted 90 deg
      clk_dout : in STD_LOGIC;        -- 250 MHz clock
      rst : in STD_LOGIC;             -- async startup reset
      -- These two signals map are connected directly to signals originating
      -- at the top-level module from the P and N pins of a differential input
      diff_in_p : in STD_LOGIC;
      diff_in_n : in STD_LOGIC;
      -- This signal the output of the "normal" LVDS receiver, routed out
      -- of this module before the IDDR registers
      nonregistered_out : out STD_LOGIC;
      dout_single : out STD_LOGIC_VECTOR(3 downto 0);
      -- Data at 1 GSPS
      dout : out STD_LOGIC_VECTOR(7 downto 0) -- Data at 2 GSPS
   );
end dual_ddr_8to1;
architecture dual_ddr_8to1 of dual_ddr_8to1 is
-- Xilinx primitive for LVDS input buffer
component IBUFDS
   generic
   (
      CAPACITANCE : string := "DONT_CARE";
      DIFF_TERM : boolean := FALSE;
      IBUF_DELAY_VALUE : string := "0";
      IFD_DELAY_VALUE : string := "AUTO";
      IOSTANDARD : string := "DEFAULT"
   );
   port
   (
      O : out std_ulogic;
      I : in std_ulogic;
      IB : in std_ulogic
   );
end component;
-- Xilinx primitive for DDR input registers
component IDDR
   generic {
      DDR_CLK_EDGE : string := "OPPOSITE_EDGE";
      INIT_Q1 : bit := '0';
      INIT_Q2 : bit := '0';
      SRTYPE : string := "SYNC"
   );
   port (
      Q1 : out std_ulogic;
      Q2 : out std_ulogic;
      C : in std_ulogic;
      CE : in std_ulogic;
      D : in std_ulogic;
      R : in std_ulogic;
      S : in std_ulogic
   );
end component;
signal diff_in, diff_in_inv : std_logic;
signal hs_dout_normal, hs_dout_invert : std_logic_vector(1 downto 0);
signal hs_dout_normal_reg, hs_dout_invert_reg :
std_logic_vector(1 downto 0);
signal dout_normal, dout_invert : std_logic_vector(3 downto 0);
begin
   invert_IBUFDS : IBUFDS
   generic map
   (
      DIFF_TERM => TRUE,
      IOSTANDARD => "LVDS_25"
   )
   port map
   (
      O => diff_in_inv,
      I => diff_in_n,
      IB => diff_in_p
   );
   normal_IBUFDS : IBUFDS
   generic map
   (
      DIFF_TERM => TRUE,
      IOSTANDARD => "LVDS_25"
   )
   port map
   (
      O => diff_in,
      I => diff_in_p,
      IB => diff_in_n
   );
   nonregistered_out <= diff_in;
   invert_IDDR_inst : IDDR
   generic map (
      DDR_CLK_EDGE => "SAME_EDGE_PIPELINED",
      INIT_Q1 => '1',
      INIT_Q2 => '1',
      SRTYPE => "ASYNC"
   )
   port map (
      Q1 => hs_dout_invert(0),
      Q2 => hs_dout_invert(1),
      C => clk_din_phi,
      CE => '1',
      D => diff_in_inv,
      R => rst,
      S => '0'
   );
   process(clk_din_phi,rst)
   begin
      if (rst='1') then
         hs_dout_invert_reg <= (others => '0');
      elsif (rising_edge(clk_din_phi)) then
         hs_dout_invert_reg <= hs_dout_invert;
      end if;
   end process;
   normal_IDDR_inst : IDDR
   generic map (
      DDR_CLK_EDGE => "SAME_EDGE_PIPELINED",
      INIT_Q1 => '0',
      INIT_Q2 => '0',
      SRTYPE => "ASYNC"
   )
   port map (
      Q1 => hs_dout_normal(0),
      Q2 => hs_dout_normal(1),
      C => clk_din,
      CE => '1',
      D => diff_in,
      R => rst,
      S => '0'
   );
   process(clk_din, rst)
   begin
      if (rst='1') then
         hs_dout_normal_reg <= (others => '0');
      elsif (rising_edge(clk_din)) then
```

```
                hs_dout_normal_reg <= hs_dout_normal;
            end if;
        end process;
        process(clk_dout,rst)
        begin
            if (rst='1') then
                dout <= (others => '0');
                dout_single <= (others => '0');
            elsif (rising_edge(clk_dout)) then
                dout(0) <= hs_dout_normal_reg(0);
                dout(1) <= not hs_dout_invert_reg(0);
                dout(2) <= hs_dout_normal_reg(1);
                dout(3) <= not hs_dout_invert_reg(1);
                dout(4) <= hs_dout_normal(0);
                dout(5) <= not hs_dout_invert(0);
                dout(6) <= hs_dout_normal(1);
                dout(7) <= not hs_dout_invert(1);
                dout_single(0) <= hs_dout_normal_reg(0);
                dout_single(1) <= hs_dout_normal_reg(1);
                dout_single(2) <= hs_dout_normal(0);
                dout_single(3) <= hs_dout_normal(1);
            end if;
        end process;
end dual_ddr_8to1;
```

B) Source Code for instantiation of a dual DDR module from (A) and connection to the module the P and N inputs and two phase clock signals:

```
library IEEE;
use IEEE.STD_LOGIC_1164.ALL;
use IEEE.STD_LOGIC_ARITH.ALL;
use IEEE.STD_LOGIC_UNSIGNED.ALL;
entity fe_top is
    GENERIC (
        NUM_DIFF_INPUTS : Integer := 37
    );
    Port
        -- async startup reset
        rst : in STD_LOGIC;
        -- clock signal received by FPGA from off-chip, used to generate
        -- clocks for sampling circuit using FPGA clocking resources
        diffclk : in STD_LOGIC;
        -- data signals in and out
        -- diff1_p and diff1_n are differential P and N inputs directly
        from pins
        diff1_p : in STD_LOGIC_VECTOR (NUM_DIFF_INPUTS-1
        downto 0);
        diff1_n : in STD_LOGIC VECTOR (NUM_DIFF_INPUTS-1
        downto 0);
        -- synchronous and asynchronous sampling outputs
        signals_at_1gs : out std_logic_vector ((NUM_DIFF_INPUTS*4)-1
        downto 0);
        signals_at_2gs : out std_logic_vector ((NUM_DIFF_INPUTS*8)-1
        downto 0);
        async_pin_route : out STD_LOGIC_VECTOR
        (NUM_DIFF_INPUTS-1 downto 0);
    );
end fe_top;
architecture Behavioral of fe_top is
    COMPONENT dual_ddr_8to1
    PORT(
        clk_din : IN std_logic;
        clk_din_phi : IN std_logic;
        clk_dout : IN std_logic;
        rst : IN std_logic;
        diff_in_p : IN std_logic;
        diff_in_n : IN std_logic;
        serdes_ce : IN std_logic;
        nonregistered_out : OUT std_logic;
        dout_single : OUT std_logic_vector(3 downto 0);
        dout : OUT std_logic_vector(7 downto 0)
        );
    END COMPONENT;
    type DUAL_ISERDES_DATABYTE is array(integer range <>)
of std_logic_vector(7 downto 0);
    signal diff1_dout :
        DUAL_ISERDES_DATABYTE(NUM_DIFF_INPUTS-1 downto 0);
    signal clk_1x, clk_2x, clk_4x : std_logic;
    signal clk_4x_phi : std_logic;
    signal second_dcm_reset : std_logic;
    -- Xilinx primitive for DCM clocking resource
    COMPONENT dcm_front_end_clocking
    PORT(
        CLKIN_IN : IN std_logic;
        RST_IN : IN std_logic;
        CLK0_CLKA1D2_OUT : OUT std_logic;
        CLK0_CLKA1D4_OUT : OUT std_logic;
        CLK0_CLKA1_OUT : OUT std_logic;
        CLK90_CLKB1_OUT : OUT std_logic;
        LOCKED_OUT : OUT std_logic
        );
    END COMPONENT;
    signal int_signals_at_2gs : std_logic_vector
        ((NUM_DIFF_INPUTS*8)-1 downto 0);
    begin
        clk_1x_out <= clk_1x;
        clk_2x_out <= clk_2x;
        clk_4x_out <= clk4x;
    second dcm reset <= '0';
        -- DCM is set up as follows
        -- CLK0_CLKA1_OUT - 500 MHz clock
        -- CLK90_CLKB1_OUT -
        500 MHz clock that following CLK0_CLKA1_OUT by 90 degrees
        -- CLK0_CLKA1D2_OUT -
        250 MHz clock phase-aligned with CLK0_CLKA1_OUT
        -- CLK0_CLKA1D4_OUT -
        125 MHz clock phase-aligned with CLK0_CLKA1_OUT
        Inst_dcm_front_end_clocking: dcm_front_end_clocking
        PORT MAP(
            CLKIN_IN => diffclk,
            RST_IN => second_dcm_reset,
            CLK0_CLKA1D2_OUT => clk_2x,
            CLK0_CLKA1D4_OUT => clk1x,
            CLK0_CLKA1_OUT => clk_4x,
            CLK90_CLKB1_OUT => clk_4x_phi,
            LOCKED_OUT => dcm_locked
        );
    IDDR_LOOP : for I in 0 to NUM_DIFF_INPUTS-1 generate
        dual_ddr_inst : dual_ddr_Sto1
        port map(
            clk_din => clk_4x,
            clk_din_phi => clk_4x_phi,
            clk_dout => clk_2x,
            rst => rst, --serdes_rst,
            diff_in_p => diff1_p(I),
            diff_in_n => diff1_n(I),
            nonregistered_out => async_pin_route(I),
            serdes_ce => '1',
            dout_single(0) => signals_at_1gs((NUM_DIFF_INPUTS*0)
            +I),
            dout_single(1) => signals_at_1gs((NUM_DIFF_INPUTS*1)
            +I),
            dout_single(2) => signals_at_1gs((NUM_DIFF_INPUTS*2)
            +I),
            dout_single(3) => signals_at_1gs((NUM_DIFF_INPUTS*3)
            +I),
            dout(0) => int_signals_at_2gs((NUM_DIFF_INPUTS*0) +I),
            dout(1) => int_signals_at_2gs((NUM_DIFF_INPUTS*1) +I),
            dout(2) => int_signals_at_2gs((NUM_DIFF_INPUTS*2) +I),
            dout(3) => int_signals_at_2gs((NUM_DIFF_INPUTS*3) +I),
            dout(4) => int_signals_at_2gs((NUM_DIFF_INPUTS*4) +I),
            dout(5) => int_signals_at_2gs((NUM_DIFF_INPUTS*5) +I),
            dout(6) => int_signals_at_2gs((NUM_DIFF_INPUTS*6) +I),
            dout(7) => int_signals_at_2gs((NUM_DIFF_INPUTS*7) +I)
        );
    end generate IDDR_LOOP;
    signals_at_2gs <= int_signals_at_2gs;
end Behavioral;
```

C) Source Code for clocking and pin constraints used in Xilinx ISE UCF files (i.e., configures P and N inputs for receiving an input signal):

```
#Clock pin/timing constraints
NET "diffclk_p" LOC = "AE14" | IOSTANDARD = LVDS_25_DCI;
NET "diffclk_n" LOC = "AE13" | IOSTANDARD = LVDS_25_DCI ;
NET "diffclk" TNM_NET = "diffclk";
TIMESPEC "TS_diffclk" = PERIOD "diffclk" 2 ns HIGH 50 %;
#Data pin constraints - note that these signals are directly
#assigned to diff1_p(x) and diff1_n(x)
NET "LA_DO_A_H<0>" LOC = "K22" | IOSTANDARD = LVDSEXT_25 | DIFF_TERM = TRUE ;
NET "LA_DO_A_H<10>" LOC = "E23" | IOSTANDARD = LVDSEXT_25 | DIFF_TERM = TRUE ;
NET "LA_DO_A_H<11>" LOC = "G24" | IOSTANDARD = LVDSEXT_25 | DIFF_TERM = TRUE ;
NET "LA_DO_A_H<12>" LOC = "D26" | IOSTANDARD = LVDSEXT_25 | DIFF_TERM = TRUE ;
NET "LA_DO_A_H<13>" LOC = "C26" | IOSTANDARD = LVDSEXT_25 | DIFF_TERM = TRUE ;
NET "LA_DO_A_H<14>" LOC = "D24" | IOSTANDARD = LVDSEXT_25 | DIFF_TERM = TRUE ;
NET "LA_DO_A_H<15>" LOC = "E25" | IOSTANDARD = LVDSEXT_25 | DIFF_TERM = TRUE ;
NET "LA_DO_A_H<16>" LOC = "A22" | IOSTANDARD = LVDSEXT_25 | DIFF_TERM = TRUE ;
NET "LA_DO_A_H<17>" LOC = "A20" | IOSTANDARD = LVDSEXT_25 | DIFF_TERM = TRUE ;
NET "LA_DO_A_H<1>" LOC = "J21" | IOSTANDARD = LVDSEXT_25 | DIFF_TERM = TRUE ;
NET "LA_DO_A_H<2>" LOC = "J26" | IOSTANDARD = LVDSEXT_25 | DIFF_TERM = TRUE ;
NET "LA_DO_A_H<3>" LOC = "J23" | IOSTANDARD = LVDSEXT_25 | DIFF_TERM = TRUE ;
NET "LA_DO_A_H<4>" LOC = "H24" | IOSTANDARD = LVDSEXT_25 | DIFF_TERM = TRUE ;
NET "LA_DO_A_H<5>" LOC = "G26" | IOSTANDARD = LVDSEXT_25 | DIFF_TERM = TRUE ;
NET "LA_DO_A_H<6>" LOC = "H22" | IOSTANDARD = LVDSEXT_25 | DIFF_TERM = TRUE ;
NET "LA_DO_A_H<7>" LOC = "H26" | IOSTANDARD = LVDSEXT_25 | DIFF_TERM = TRUE ;
NET "LA_DO_A_H<8>" LOC = "F26" | IOSTANDARD = LVDSEXT_25 | DIFF_TERM = TRUE ;
NET "LA_DO_A_H<9>" LOC = "F24" | IOSTANDARD = LVDSEXT_25 | DIFF_TERM = TRUE ;
NET "LA_DO_A_L<0>" LOC = "K21" | IOSTANDARD = LVDSEXT_25 | DIFF_TERM = TRUE ;
NET "LA_DO_A_L<10>" LOC = "E22" | IOSTANDARD = LVDSEXT_25 | DIFF_TERM = TRUE ;
NET "LA_DO_A_L<11>" LOC = "G23" | IOSTANDARD = LVDSEXT_25 | DIFF_TERM = TRUE ;
NET "LA_DO_A_L<12>" LOC = "D25" | IOSTANDARD = LVDSEXT_25 | DIFF_TERM = TRUE ;
NET "LA_DO_A_L<13>" LOC = "C25" | IOSTANDARD = LVDSEXT_25 | DIFF_TERM = TRUE ;
NET "LA_DO_A_L<14>" LOC = "C24" | IOSTANDARD = LVDSEXT_25 | DIFF_TERM = TRUE ;
NET "LA_DO_A_L<15>" LOC = "E24" | IOSTANDARD = LVDSEXT_25 | DIFF_TERM = TRUE ;
NET "LA_DO_A_L<16>" LOC = "A21" | IOSTANDARD = LVDSEXT_25 | DIFF_TERM = TRUE ;
NET "LA_DO_A_L<17>" LOC = "A19" | IOSTANDARD = LVDSEXT_25 | DIFF_TERM = TRUE ;
NET "LA_DO_A_L<1>" LOC = "J20" | IOSTANDARD = LVDSEXT_25 | DIFF_TERM = TRUE ;
NET "LA_DO_A_L<2>" LOC = "J25" | IOSTANDARD = LVDSEXT_25 | DIFF_TERM = TRUE ;
NET "LA_DO_A_L<3>" LOC = "J22" | IOSTANDARD = LVDSEXT_25 | DIFF_TERM = TRUE ;
NET "LA_DO_A_L<4>" LOC = "H23" | IOSTANDARD = LVDSEXT_25 | DIFF_TERM = TRUE ;
NET "LA_DO_A_L<5>" LOC = "G25" | IOSTANDARD = LVDSEXT_25 | DIFF_TERM = TRUE ;
NET "LA_DO_A_L<6>" LOC = "H21" | IOSTANDARD = LVDSEXT_25 | DIFF_TERM = TRUE ;
NET "LA_DO_A_L<7>" LOC = "H25" | IOSTANDARD = LVDSEXT_25 | DIFF_TERM = TRUE ;
NET "LA_DO_A_L<8>" LOC = "E26" | IOSTANDARD = LVDSEXT_25 | DIFF_TERM = TRUE ;
NET "LA_DO_A_L<9>" LOC = "F23" | IOSTANDARD = LVDSEXT_25 | DIFF_TERM = TRUE ;
NET "LA_DO_B_H<0>" LOC = "D23" | IOSTANDARD = LVDSEXT_25 | DIFF_TERM = TRUE ;
NET "LA_DO_B_H<10>" LOC = "C21" | IOSTANDARD = LVDSEXT_25 | DIFF_TERM = TRUE ;
NET "LA_DO_B_H<11>" LOC = "L19" | IOSTANDARD = LVDSEXT_25 | DIFF_TERM = TRUE ;
NET "LA_DO_B_H<12>" LOC = "C17" | IOSTANDARD = LVDSEXT_25 | DIFF_TERM = TRUE ;
NET "LA_DO_B_H<13>" LOC = "E17" | IOSTANDARD = LVDSEXT_25 | DIFF_TERM = TRUE ;
NET "LA_DO_B_H<14>" LOC = "F18" | IOSTANDARD = LVDSEXT_25 | DIFF_TERM = TRUE ;
NET "LA_DO_B_H<15>" LOC = "F20" | IOSTANDARD = LVDSEXT_25 | DIFF_TERM = TRUE ;
NET "LA_DO_B_H<16>" LOC = "G18" | IOSTANDARD = LVDSEXT_25 | DIFF_TERM = TRUE ;
NET "LA_DO_B_H<17>" LOC = "C19" | IOSTANDARD = LVDSEXT_25 | DIFF_TERM = TRUE ;
NET "LA_DO_B_H<1>" LOC = "D22" | IOSTANDARD = LVDSEXT_25 | DIFF_TERM = TRUE ;
NET "LA_DO_B_H<2>" LOC = "B18" | IOSTANDARD = LVDSEXT_25 | DIFF_TERM = TRUE ;
NET "LA_DO_B_H<3>" LOC = "A24" | IOSTANDARD = LVDSEXT_25 | DIFF_TERM = TRUE ;
NET "LA_DO_B_H<4>" LOC = "E21" | IOSTANDARD = LVDSEXT_25 | DIFF_TERM = TRUE ;
NET "LA_DO_B_H<5>" LOC = "G19" | IOSTANDARD = LVDSEXT_25 | DIFF_TERM = TRUE ;
NET "LA_DO_B_H<6>" LOC = "H20" | IOSTANDARD = LVDSEXT_25 | DIFF_TERM = TRUE ;
NET "LA_DO_B_H<7>" LOC = "B24" | IOSTANDARD = LVDSEXT_25 | DIFF_TERM = TRUE ;
NET "LA_DO_B_H<8>" LOC = "C20" | IOSTANDARD = LVDSEXT_25 | DIFF_TERM = TRUE ;
NET "LA_DO_B_H<9>" LOC = "D20" | IOSTANDARD = LVDSEXT_25 | DIFF_TERM = TRUE ;
NET "LA_DO_B_L<0>" LOC = "C23" | IOSTANDARD = LVDSEXT_25 | DIFF_TERM = TRUE ;
NET "LA_DO_B_L<10>" LOC = "B21" | IOSTANDARD = LVDSEXT_25 | DIFF_TERM = TRUE ;
NET "LA_DO_B_L<11>" LOC = "K20" | IOSTANDARD = LVDSEXT_25 | DIFF_TERM = TRUE ;
NET "LA_DO_B_L<12>" LOC = "D17" | IOSTANDARD = LVDSEXT_25 | DIFF_TERM = TRUE ;
NET "LA_DO_B_L<13>" LOC = "F17" | IOSTANDARD = LVDSEXT_25 | DIFF_TERM = TRUE ;
NET "LA_DO_B_L<14>" LOC = "E18" | IOSTANDARD = LVDSEXT_25 | DIFF_TERM = TRUE ;
NET "LA_DO_B_L<15>" LOC = "E20" | IOSTANDARD = LVDSEXT_25 | DIFF_TERM = TRUE ;
NET "LA_DO_B_L<16>" LOC = "G17" | IOSTANDARD = LVDSEXT_25 | DIFF_TERM = TRUE ;
NET "LA_DO_B_L<17>" LOC = "D18" | IOSTANDARD = LVDSEXT_25 | DIFF_TERM = TRUE ;
NET "LA_DO_B_L<1>" LOC = "C22" | IOSTANDARD = LVDSEXT_25 | DIFF_TERM = TRUE ;
NET "LA_DO_B_L<2>" LOC = "A18" | IOSTANDARD = LVDSEXT_25 | DIFF_TERM = TRUE ;
NET "LA_DO_B_L<3>" LOC = "A23" | IOSTANDARD = LVDSEXT_25 | DIFF_TERM = TRUE ;
NET "LA_DO_B_L<4>" LOC = "D21" | IOSTANDARD = LVDSEXT_25 | DIFF_TERM = TRUE ;
NET "LA_DO_B_L<5>" LOC = "F19" | IOSTANDARD = LVDSEXT_25 | DIFF_TERM = TRUE ;
NET "LA_DO_B_L<6>" LOC = "G20" | IOSTANDARD = LVDSEXT_25 | DIFF_TERM = TRUE ;
NET "LA_DO_B_L<7>" LOC = "B23" | IOSTANDARD = LVDSEXT_25 | DIFF_TERM = TRUE ;
NET "LA_DO_B_L<8>" LOC = "B20" | IOSTANDARD = LVDSEXT_25 | DIFF_TERM = TRUE ;
NET "LA_DO_B_L<9>" LOC = "D19" | IOSTANDARD = LVDSEXT_25 | DIFF_TERM = TRUE ;
```

Although the Xilinx-4 FPGA is preferred, other FPGA chips may be used, or other logical elements integrated to provide the same functionality. The FPGA is configured at such time where the printed circuit board (PCB) having the chips, FPGA 16, SDRAM 18, USB microcontroller 17 are manufactured and such PCB is located in a housing for the acquisition device 12 (or may be part of a system (or housing) including computer system 20). Power supply may be through the USB connection 59 or by a power supply (battery or external AC power) in acquisition device 12.

Further, although the logic in demultiplexer 26 for each channel is described as receiving the same input from two differential receivers 34, 35 of opposite polarity to two I/O tiles 36 and 37 to provide four samples in accordance with two phase shifted clock signals, as shown in FIG. 4, four I/O tiles of the FPGA may be used providing eight registers where the additional two I/O tiles each receive the output from one of receivers 34 and 35, and the eight registers are enabled in the same manner described with four registers to provide eight samples with the use of four phase clocking signals at 0, 45, 90 and 135 degrees to the four I/O tiles, respectively, which can provide sampling of input signals up to 4 GS/s. Other number of I/O tiles and phase timing signals greater than two I/O tiles may similarly be used to provide different sampling rates at more than four times the clock speed, so long as busses 27a, 27b, and 27c are provided to accommodate bandwidth of the additional samples for each of the given number of channels, or other data flow and memory architecture is used to transfer and store sample data into memory 18 representative of the high rate sampled input signals.

Figure 10:
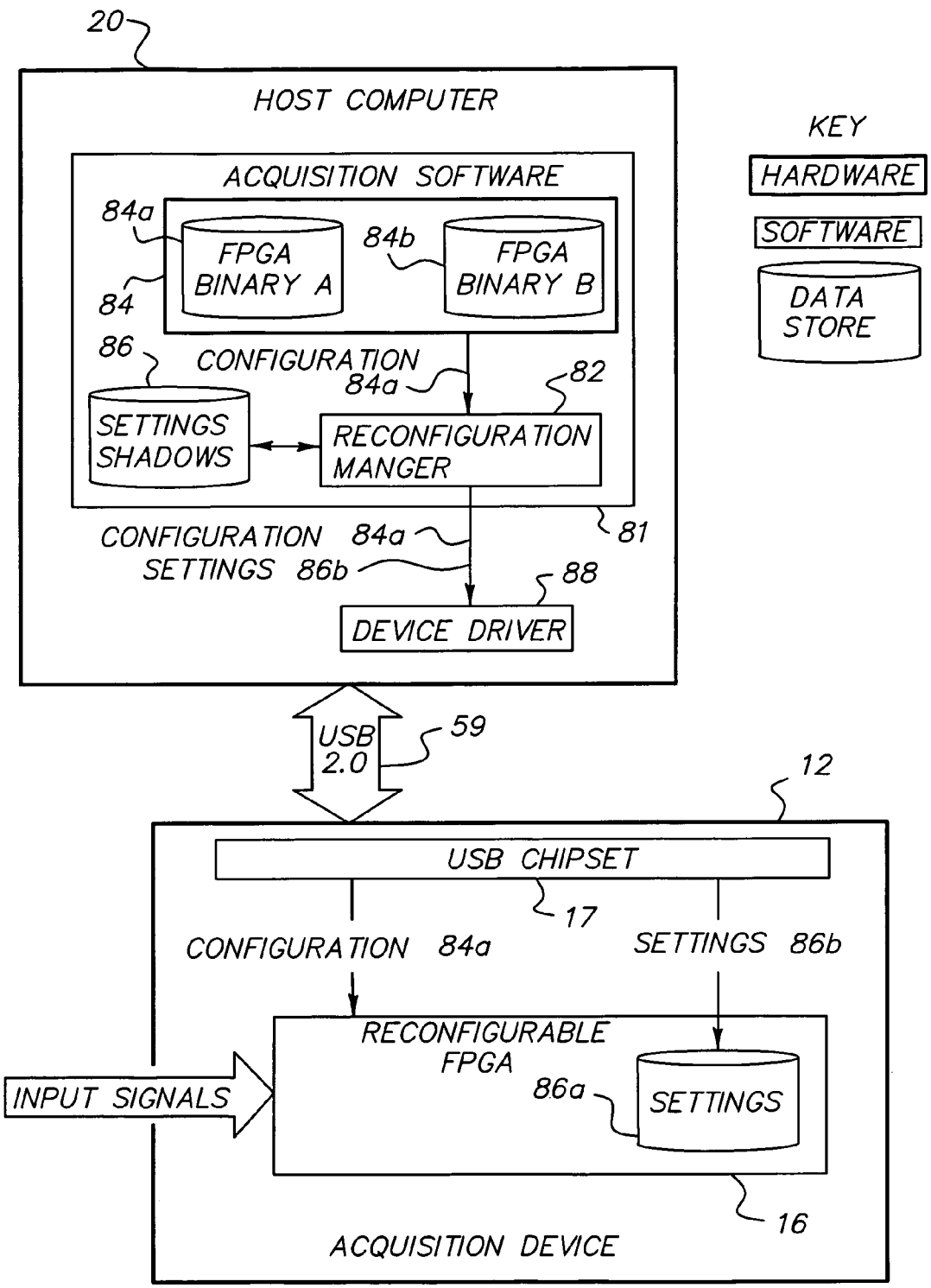
FIG. 10 is a diagram of another embodiment of the present invention having a system with a reconfigurable acquisition device coupled to a computer system.
Figure 11:
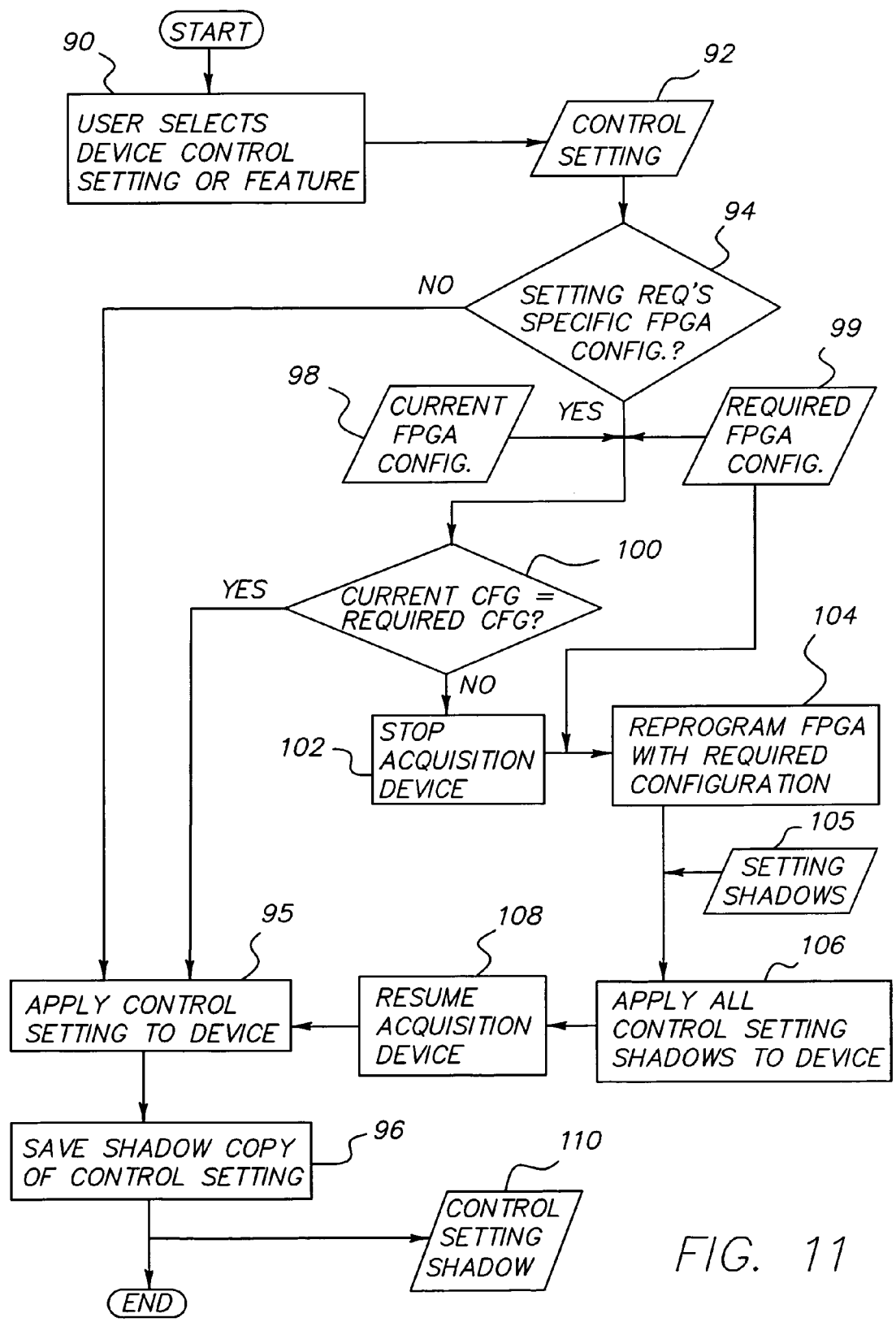
FIG. 11 is flow chart of the operation of the computer system of the embodiment of FIG. 10.

Referring to FIGS. 10 and 11, another embodiment of the present invention is shown. The FPGA 16 as stated above is configured to provide the desired functionality. However, the FPGA may be dynamically reconfigured by computer system 20 to achieve other functionality than those described in connection with FIGS. 1-9. This avoids the inflexibility of particular hardware of an acquisition device once designed and manufactured, and reduces manufacturing cost by avoiding the need to manufacture multiple types of acquisition devices with different configured FPGA chips, and allows customization to the particular acquisition needs of users, thereby improving the capabilities of the acquisition device.

As stated earlier, system 10 has an acquisition device 12 and computer system (or host) 20. These two components can be embodied either in physically separate entities or a single computer system. Although connectivity between them is shown as USB, other data link communication may be used, such as PCI, Firewire, Ethernet, Bluetooth, and other wired or wireless communications links. FIG. 10 shows the main two components of the acquisition device 12 of this embodiment, a processing unit 16 to control the device and perform the acquisitions of received input signals, and a USB controller 17 to provide a communications link to the host computer. Although not shown in acquisition device 12, memory 18 may also be provided in device 12. The processing unit is preferably an ASIC, FPGA, Microprocessor, or other way, but in this embodiment is an FPGA as it allows for reconfiguration. This FPGA is not limited to the Xilinx-4 FPGA. The computer system 20 has a typical operating system, and has acquisition software 81 for enabling one of different modes of operation of acquisition device 12. Such software may be in addition to software operating on the computer system 20 enabling interaction with acquisition device 12 described earlier. In this embodiment the acquisition software 81 refers to software running on computer system 20 for handling selection and swapping of one of different configurations of the FPGA 16 to provide different modes of operation.

Acquisition software 81 has three components: a reconfiguration manager 82, FPGA configuration store 84, and the shadow settings data 86. The reconfiguration manager 82 is responsible for maintaining the FPGA configuration store 84, the shadow settings data 86, and for monitoring all setting requests received through the user interface and enables computer system 20 to operate in accordance with FIG. 11.

FPGA configuration store 84 represent memory of the computer system 20 storing binary files for programming the acquisition device's FPGA 16 into various modes of operation by varying one more characteristics of: sampling rates; number of channels; trigger types or logic rules, or other settings not general to all of the configurations in store 84, by which the acquisition device 12 is operable. For example, one mode may be for acquiring up to 2 GS/s input signals on 36 channels, a second mode for acquiring up to 1 GS/s input signals on 36 channels, and a third mode for acquiring 18 channels at 2 GS/s with the same or different trigger, or other combinations of various features. Each binary file may be one such as typically generated by developer software that is provided by the FPGA manufacturer with the particular FPGA chip to program its operation in device 12 for acquiring data. The computer system 20 stores in its memory the feature set of characteristics associated with each of the files in store 84 for use in determining when a user selects a change in operation of system 10, whether or not to reprogram the FPGA in accordance with one of the files of store 84. Accordingly, a discussion of the particular manner of the development of such binary file and its operation to program FPGA functionality and settings is outside the scope of this invention. Any number of binary files can be provided based on the capabilities of the FPGA and the feature set desired. The computer system may handle thousands of different configurations and is constricted only by the storage space available on the computer system 20. For purposes of illustration, two binary files 84a and 84b associated with two different FPGA configurations are shown in configuration store 84.

Whenever the user selects a setting (or feature) effecting one or more characteristics of acquisition device 12 operation, the manager 82 updates the configuration of the FPGA 16 in accordance with one of the binary files, if needed, from store 84. At this same time, a shadowed version (or copy) 86 of the acquisition device's current settings which is kept updated in memory of the computer system 20 whenever new setting(s) are selected by the user at the computer system 20 are applied to the acquisition device 12. When the configuration of the FPGA 16 is reprogrammed, the reconfiguration manager 82 immediately reapplies all relevant device 12 settings to the newly configured device. Relevant refers to all acquisition device 12 settings which are supported by the newly configured form of the FPGA 16. In this way the FPGA 16 can be completely reconfigured as needed, quickly, and unbeknownst to the user, without fear of loosing important settings or having to read data out of the hardware first. This provides for a faster transition during reconfiguration and simplifies the acquisition device hardware by not having to remember settings or provide for reading them out.

The settings shadows 86 maintained by acquisition software 81 enable fast and seamless reconfiguration of the acquisition device 12. These shadows are a super-set of all possible configuration settings that the user can apply to the acquisition device hardware (i.e., FPGA 16) in any of its forms as made available by the configuration store 84. This includes more generic parameters, such as sample rate, which would likely apply to any specific FGPA configuration; as well as configuration-specific parameters such as triggering settings that might only apply to a given FPGA mode.

In the acquisition device, the FPGA 16 operates in accordance with settings 86a stored in the FPGA memory. When the FPGA is reconfigured by the host computer system 20, one of the FPGA binary configurations from the configuration store 84 and the shadow settings 86 are uploaded, via the driver 88 of the computer system, which enables interface of the computer system 20 with the USB controller 17 over a USB connection 59 (or other wired or wireless communication protocol). Each configuration file has a program which reconfigures FPGA 16 logic and its settings 86a. The microprocessor 56 (FIG. 3B) of controller 17 is coupled to programming lines of the FPGA 16 to apply (or upload) the configuration of the binary file from store 84 to reprogram FPGA 16 operation and its settings 86a. Settings 86a is thus overwritten (such as with default setting), and then is replaced with the previous settings of shadow settings 86.

The acquisition software 81 running on the computer system 20 is responsible for managing the process of hardware (i.e., FPGA) reconfiguration and maintenance of the current settings and ensuring that these changes are quick and seamless to the user. In order to be most effective the software 81 should completely hide the complexity of reconfiguration from the user. Instead all functionality should appear present at all times. In a preferred embodiment, the data link between computer system 20 and acquisition device 12 to the hardware is fast enough that the entire FPGA can be reconfigured and running again in less time than would be noticeable to the user upon selection of an option.

The computer system 20 operates in accordance with flow chart of FIG. 11 to manage the dynamic reconfiguration of an FPGA to provide a wide range of desired functionality to the user quickly and unobtrusively. The user first selects the acquisition device 12 control setting(s) (i.e., functionality, mode, such as one of characteristics mentioned earlier) (step 90), such as via a display providing a list of available settings from which the user may select, via the user interface of the computer system 20. The control setting(s) are inputted via a user interface device attached to the computer system 20, such as a keyboard, mouse, touch screen, buttons, or the like (step 92). If the setting(s) requested requires no particular FPGA configuration (step 94), then at step 95 the control setting(s) are applied to FPGA 16 (step 95) and a copy 110 is saved in shadow memory storage 86 (step 96). For example, settings which require no new FPGA configuration may be a stop acquisition setting, or start acquisition setting, which would apply to any and all configurations of the FPGA of store 84.

If at step 94 a specific FPGA configuration is needed, then both the current FPGA configuration and required FPGA configuration is determined by the computer system 20 and compared at step 100. The computer system 20 determines when a specific configuration is required when the control setting(s) entered at step 92 affects one of the setting(s) not general to all of the configurations of store 84, such as the sample rate, number of channels, and/or trigger logic rules, or other setting particular to one or more, but not all of the configurations of store 84. Each configuration of store 84 may have a unique identifier, such as filename or number (or is unique by reference to a unique group of settings associated with the configuration). The computer, system 20 stores in its memory the current configuration of the FPGA when last downloaded to the acquisition device 12, thus enabling a comparison between the current configuration and the required configuration at step 100. If they are the same, then steps 95, 96, and 110 are performed as described above, otherwise computer system 20 sends a command to the acquisition device 12 to stop (step 102), and the required FPGA configuration 99 is sent to the acquisition device 12 to reprogram the FPGA 16 (step 104). This undesirably overwrites or wipes out the previous settings at 86a. Accordingly, the shadow settings 86 (i.e., those settings 105 which are supported by the newly reprogrammed FPGA 16) are then read and sent to the acquisition device 12 to apply to the FPGA 16 (step 106) and the acquisition device 12 stores such settings at 86a. Acquisition device 12 resumes operation in accordance with the reconfigured FPGA (step 108), and steps 95, 96, and 110 are performed as described above. In this manner, acquisition device 12 is reprogrammable to enable different modes of operation as desired by the user.

In FIG. 10, the required FPGA configuration 99 (FIG. 11) is denoted as configuration 84a which is provided by the manager 82 to reprogram FPGA 16, via driver 88, USB connection 59, and USB controller 17, but any other of the configurations of configuration store 84 may selected to achieve the user desired mode of acquisition device operation. Settings 105 (FIG. 11) from shadow settings storage 86 that are determined relevant by manager 82 for configuration 84a are denoted as settings 86a in FIG. 10, and are sent to the reprogrammed FPGA 16, via driver 88, USB connection 59, and USB controller 17.

Using a dynamically reconfigurable FPGA in conjunction with a settings shadow store allows acquisition system 10 to modify the functionality and capabilities of the acquisition device 12 while running. Instead of all features desired in the device 12 being present at all times, they can be broken down into multiple logical sections, each implemented within a unique FPGA 16 configuration in configuration store 84. The major benefit of this is that a smaller and cheaper FPGA 16 can then be used as it only needs to be capable of holding a subset of the overall device functionality at any one time. Instead, by separating the functionality into individual configurations, greater performance in different areas can be provided and development time can be reduced and simplified. At any time the user can choose the modality that best suits their needs. The result is an acquisition device 12 that is customizable to the degree offered by the developer, instead of being limited by trying to be everything to everyone.

A further advantage of utilizing a reconfigurable FPGA in accordance with this embodiment is the ability to fix bugs, upgrade the device, and add functionality. All of these can be provided to the user in the field through software updates. Additional FPGA binary files can be provided and sold by the developer for application specific purposes without requiring the customer to return the hardware or purchase a new unit. In this way features can be added indefinitely to the hardware platform of the acquisition device 12. When bugs are discovered in the software or in the hardware's FPGA, updates can be sent to users immediately to solve the problems without having to perform expensive hardware revisions and ship them to customers. The result is that the reconfiguration software allows a very flexible and extensible acquisition hardware solution with many benefits to both developers and end-users.

From the foregoing description it will be apparent that there has been provided an improved system and method for data acquisition of electrical test and measurements signals. The illustrated description as a whole is to be taken as illustrative and not as limiting of the scope of the invention. Such variations, modifications and extensions, which are within the scope of the invention, will undoubtedly become apparent to those skilled in the art.

The invention claimed is:

1. A device acquiring signals receiving one or more input signals comprising:

a plurality of N registers each having an input and an output;

two differential receivers of opposite polarity each having an output coupled to the input of different groups of said N registers, in which each of said differential receivers receive simultaneously the same input signal, and each of said registers when enabled sample the input signal, wherein each of said groups comprises two different ones of said N registers; and a plurality of clock signals of different phase from each other which are each coupled to the enable of different groups of said registers, in which the clock signal to one of the registers in each of said groups of registers is inverted so that said N registers sample the input signal provided by said differential receivers at N times the rate of the clock signal.

2. The device according to claim 1 wherein the outputs from the registers coupled to one of said two differential receivers are inverted.

3. The device according to claim 1 wherein at least said registers and said differential receivers are enabled by a Field Programmable Gate Array which generates said clocking signals.

4. The device according to claim 1 wherein N equals 4.

5. The device according to claim 1 wherein N greater than 4.

6. A system for acquiring and reading out test and measurement signals comprising:

an acquisition device for receiving one or more input signals, in which said acquisition device has means for generating two clock signals of different phase at a clock rate, and for each one of one or more input signals said acquisition device comprises:

two pairs of registers each having an input, an output, and an enable input to latch a signal at the input to the output;

two differential receivers of opposite polarity each having an output coupled to the input of different ones of said pair of registers, in which each of said differential receivers receives simultaneously the same input signal, in which said two clock signals of different phase each coupled to the enable input of a different ones of said pair of registers, in which the enable input to one of the registers in each of said pairs of registers is inverted, to enable the output of each of the registers to sample the input signal provided by the differential receivers at four times the clock rate, wherein the outputs of the registers of one pair oldie registers is inverted to match the polarity of the outputs of the registers of the other pair of registers to provide sample data representative of the input signal; and memory for storing said sample data for each of the channels; and a computer system for requesting sample data from said acquisition device and said acquisition device providing said requested sample data from said memory to said computer system.

7. The system according to claim 6 wherein said clock signals are provided to said registers associated with each of the input signals to enable synchronous sampling of each of said input signals in parallel.

8. The system according to claim 6 wherein each of said clock signals has rising and falling edges, and said registers are capable of being enabled on both the rising and falling edge of the clock signal at the respective enable of said registers.

9. The system according to claim 6 wherein said means generates two clock signals in which a one of said clock signals is 90 degree phase shifted from the other of said clock signals.

10. The system according to claim 6 wherein at least said registers and said differential receivers are enabled by a Field Programmable Gate Array having said means for generating said clocking signals.

11. The system according to claim 6 further comprising a controller having multiple ports, in which one of said ports receives said sample data from said registers and said controller then stores said received sample data in said memory, and another of said ports provides readout of said sample data stored in said memory.

12. The system according to claim 11 wherein said polls are capable of being operated simultaneous to enable readout of acquired stored sample data from memory, and storage of newly acquired sample data at the same time.

13. The system according to claim 11 wherein said controller generates pointers to addresses in said memory where to store said sample data from said registers.

14. The system according to claim 13 wherein said controller represents a first controller, and said acquisition device further comprises a second controller in which said first controller provides to said second controller at least each of said pointers when generated and sends said pointers to said computer system.

15. The system according to claim 14 wherein said second controller, responsive to a request from said computer system for readout from said memory at addresses associated with stored sample data, sends the received addresses to said first controller for reading said stored sample data from said memory at said addresses, and said first controller reads and then outputs said sample data from said memory to said second controller which then provides said read sample data to the computer system.

16. The system according to claim 6 wherein said acquisition device for each of said one or more input signals comprises:

a downsampler which receives said sample data from said registers to produce for every M number of sample data downsampled data having a first value representative of at least one of the M sample data, and a second value recording the occurrence of a toggle event that occurred during the M number of sample data.

17. The system according to claim 16 further comprising a controller for receiving said sample data from said registers for each of said channels and storing said sample data in said memory, and for receiving from said downsampler for each of said channels said downsampled data and storing said downsampled data for each of said channels in said memory.

18. The system according to claim 17 wherein said controller generates first pointers to addresses in said memory to store said sample data for each of said channels, and said controller generates second pointers to addresses in said memory to store said downsampled data for each of said channels, wherein said first and second pointers are generated simultaneously, and said first and second pointers are continuously sent to said computer system.

19. The system according to claim 18 wherein said controller represents a first controller, and said acquisition device further comprises a second controller in which said first controller provides to said second controller at least each of said first and second pointers when generated and sends said first and second pointers to said computer system.

20. The system according to claim 19 wherein said second controller, responsive to a request from said computer system for readout from said memory at addresses associated with one of said stored sample data or said stored downsampled data, sends the received addresses to said first controller for reading said stored sample data from said memory at said addresses, and said first controller reads and then outputs one of said sample data or downsampled data from said memory to said second controller which then provides said read data to the computer system.

21. The system according to claim 20 wherein said computer system has a display for rendering said read data on the display.

22. The system according to claim 20 wherein said computer system enables a user to select a timeframe, and said computer system automatically determines when to readout from addresses associated with said timeframe from one of said sample data and downsampled data stored in said memory in accordance with at least the selected timeframe and resolution of said display to be utilized for rendering said data when read from said memory.

23. A device acquiring test and measurement signals using a Field Programmable Gate Array receiving one or more input signals in which for each one said input signals said device comprises:
- two pairs of registers each having an input, an output, and an enable input to latch a signal at the input to the output;
- two differential receivers of opposite polarity each having an output coupled to the input of different ones of said pair of registers, in which each of said differential receivers receives simultaneously a same one of said input signals; and
- two clock signals of different phase operate at the same rate and are each coupled to the enable input of a different ones of said pair of registers, in which the enable input to one of the registers in each of said pairs of registers is inverted, to enable the registers to sample the input signal provided by said differential receivers at four times said rate of the clock signals, wherein the outputs of the registers of one pair of the registers is inverted to match the polarity of the outputs of the registers of the other pair of registers.

24. The device according to claim 23 further comprising a downsampler which receives said sample data from said registers to produce for every M number of sample data downsampled data having a first value representative of at least one of the M sample data, and a second value recording the occurrence of a toggle event that occurred during the M number of sample data.

25. The device according to claim 23 further comprising a controller and memory, and said controller comprises three ports a first port to receive said sample data, a second port to receive said downsampled data, and a third port to readout one of said sample data and said downsampled data stored in said memory.

26. The device according to claim 23 wherein said controller generates first pointers to said memory for storing sample data received at said first port, generates second pointers to said memory for storing downsampled data received at said second port, and sends said first and second pointers when generated to said computer system to enable said computer system to request from said device readout from said third port one of said stored sample data or downsampled data in accordance with said received pointers, in which said three ports are capable of operating simultaneously.

27. The system according to claim 6 wherein said memory represents first memory, and
said acquisition device further comprises a Field Programmable Gate Array (FPGA) for storing said sample data in said first memory, in which said FPGA operates in accordance with configuration and settings at the FPGA defining FPGA operation; and
said computer system has second memory storing a plurality of FPGA configurations in which each of said plurality of FPGA configurations when applied to said FPGA reconfigures said FPGA to enable a plurality of different modes of operation of said acquisition device in accordance with one or more user selectable characteristics of the acquisition device operation, and said computer system in response to user selection of said one or more characteristics of the acquisition device operation automatically determines which one of said stored plurality of FPGA configurations provides said selected one or more characteristics of acquisition device operation and automatically transfers the determined one of said FPGA configurations to the acquisition device which when applied to the FPGA reconfigures the FPGA to enable one of said plurality of different modes of the acquisition device operation for said selected one or more characteristics without affecting user operation of the acquisition device so that said transfer and reconfiguration of the FPGA occurs seamlessly and unobtrusively to the user.

28. The system according to claim 27 wherein said second memory stores storing current settings of the acquisition device, and after said FPGA configuration is updated, said settings are transferred from said second memory of said computer system to said acquisition device to restore the settings of the FPGA.

29. The system according to claim 27 wherein each of said plurality of FPGA configurations represents a subset of different ones of said one or characteristics.

30. The system according to claim 27 wherein said one or more characteristics represents one or more of sample rate, number of channels, or trigger type.

* * * * *